(12) United States Patent
Yoo et al.

(10) Patent No.: US 11,782,467 B2
(45) Date of Patent: Oct. 10, 2023

(54) ABNORMAL VOLTAGE MONITORING DEVICE, AND STORAGE AND VEHICLE COMPRISING THE ABNORMAL VOLTAGE MONITORING DEVICE

(71) Applicant: Samsung Electronics Co., Ltd., Suwon-si (KR)

(72) Inventors: Sung Yun Yoo, Yongin-si (KR); Ji Soo Lee, Anyang-si (KR)

(73) Assignee: Samsung Electronics Co., Ltd.

( * ) Notice: Subject to any disclaimer, the term of this patent is extended or adjusted under 35 U.S.C. 154(b) by 2 days.

(21) Appl. No.: 17/529,356

(22) Filed: Nov. 18, 2021

(65) Prior Publication Data

US 2022/0350353 A1    Nov. 3, 2022

(30) Foreign Application Priority Data

Apr. 29, 2021  (KR) .......................... 10-2021-0055745

(51) Int. Cl.
*G05F 1/56*  (2006.01)
*G01R 19/165*  (2006.01)
*B60R 16/02*  (2006.01)

(52) U.S. Cl.
CPC ................ *G05F 1/56* (2013.01); *B60R 16/02* (2013.01); *G01R 19/16566* (2013.01)

(58) Field of Classification Search
None
See application file for complete search history.

(56) References Cited

U.S. PATENT DOCUMENTS

| | | | | |
|---|---|---|---|---|
| 5,712,590 A | * | 1/1998 | Dries | G05F 3/227 327/539 |
| 6,373,326 B1 | | 4/2002 | Tomari | |
| 6,717,865 B2 | | 4/2004 | Laurent | |
| 7,200,066 B2 | * | 4/2007 | Krenzke | G11C 5/147 365/189.09 |
| 7,466,115 B2 | * | 12/2008 | Biagi | H03F 1/52 323/280 |
| 7,679,133 B2 | | 3/2010 | Son et al. | |
| 7,692,996 B2 | | 4/2010 | Resnick | |
| 7,843,186 B2 | * | 11/2010 | Nishida | H02M 3/158 323/284 |
| 8,093,932 B2 | | 1/2012 | Kwon et al. | |

(Continued)

*Primary Examiner* — Thomas J. Hiltunen
(74) *Attorney, Agent, or Firm* — Myers Bigel, P.A.

(57) ABSTRACT

The present disclosure provides an abnormal voltage monitoring device, a storage device, and a vehicle. The abnormal voltage monitoring device comprises a voltage divider configure to receive an input voltage from a voltage generator and output a first distribution voltage based on the input voltage, a second bandgap reference generation circuit configured to output a reference voltage, and a monitoring circuit configured to receive the first distribution voltage from the voltage divider and the reference voltage from the second bandgap reference generation circuit, and output an alarm signal responsive to comparing a voltage level of the first distribution voltage with that of the reference voltage. The voltage generator comprises a first bandgap reference generation circuit, and the second bandgap reference generation circuit is configured to generate the reference voltage differently than the first bandgap reference generation circuit.

20 Claims, 19 Drawing Sheets

(56) References Cited

U.S. PATENT DOCUMENTS

| | | | |
|---|---|---|---|
| 8,125,800 B2* | 2/2012 | Forghani-zadeh | H02M 1/36 |
| | | | 323/287 |
| 8,183,905 B2* | 5/2012 | Chang | H03B 5/368 |
| | | | 327/293 |
| 8,253,397 B2* | 8/2012 | Collins | H02M 3/156 |
| | | | 323/283 |
| 8,350,554 B2 | 1/2013 | Kang et al. | |
| 8,553,466 B2 | 10/2013 | Han et al. | |
| 8,559,235 B2 | 10/2013 | Nam et al. | |
| 8,654,587 B2 | 2/2014 | Yoon et al. | |
| 9,190,988 B1* | 11/2015 | Gupta | H03K 3/012 |
| 9,304,174 B1 | 4/2016 | Taylor et al. | |
| 9,354,124 B2 | 5/2016 | Horng et al. | |
| 9,886,047 B2* | 2/2018 | Yoshii | G05F 3/30 |
| 9,910,075 B2* | 3/2018 | Laird | G01R 15/12 |
| 10,534,386 B2* | 1/2020 | Chang | G05F 1/56 |
| 10,763,809 B2* | 9/2020 | Delshadpour | H03G 3/001 |
| 2009/0201067 A1* | 8/2009 | Haneda | G05F 3/30 |
| | | | 327/512 |
| 2010/0233648 A1 | 9/2010 | McSpadden et al. | |
| 2011/0115520 A1* | 5/2011 | Horsky | G01R 31/64 |
| | | | 323/273 |
| 2018/0083533 A1* | 3/2018 | Price | G05F 1/56 |
| 2021/0004033 A1* | 1/2021 | Balasubramaniam | G05F 1/595 |

\* cited by examiner

ABNORMAL VOLTAGE MONITORING DEVICE, AND STORAGE AND VEHICLE COMPRISING THE ABNORMAL VOLTAGE MONITORING DEVICE

CROSS-REFERENCE TO RELATED APPLICATION

This application claims priority from Korean Patent Application No. 10-2021-0055745 filed on Apr. 29, 2021 in the Korean Intellectual Property Office, and all the benefits accruing therefrom under 35 U.S.C. 119, the contents of which in its entirety are herein incorporated by reference.

FIELD

The present disclosure relates to an abnormal voltage monitoring device for monitoring a voltage applied to a memory cell, a storage device comprising the abnormal voltage monitoring device, and a vehicle.

BACKGROUND

With the development of the vehicle driving-related technology such as autonomous driving, types of semiconductor devices mounted on a vehicle have been increased. The semiconductor devices mounted on the vehicle may include a plurality of memory devices for storing driving data required for or generated while driving the vehicle. Generally, a voltage level may differently be set depending on an operation of a memory device, such as a data program operation, a read operation and an erase operation, and when a voltage outside of a set voltage level range is applied, reliability of the operation cannot be guaranteed. In particular, the memory device mounted on the vehicle should stably operate even in a severe environment having a larger change in temperature, humidity, etc. than a general electronic device. When an operation failure occurs, it could lead to an accident. In this respect, a device capable of monitoring whether a voltage applied to a memory is maintained within a specific voltage level range may be desired.

SUMMARY

Aspects of the present disclosure provide an abnormal voltage monitoring device for monitoring a voltage applied to a memory cell, a storage device comprising the abnormal voltage monitoring device, and a vehicle.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, an abnormal voltage monitoring device comprises a voltage divider configured to receive an input voltage to be applied to a memory cell, from a voltage generator comprising a first bandgap reference generation circuit, and configured to output a first distribution voltage based on the input voltage; a second bandgap reference generation circuit configured to output a reference voltage; and a monitoring circuit configured to receive the first distribution voltage from the voltage divider and the reference voltage from the second bandgap reference generation circuit, and configured to output an alarm signal responsive to comparing a voltage level of the first distribution voltage with that of the reference voltage, wherein the second bandgap reference generation circuit is configured to generate the reference voltage differently than the first bandgap reference generation circuit is configured to generate the input voltage.

According to an aspect of the present disclosure, a storage device comprises a memory cell; a voltage generator configured to generate an input voltage to be applied to the memory cell using a first bandgap reference generation circuit; a control logic circuit configured to control operation of the voltage generator; and a voltage monitor configured to monitor the input voltage based on a reference voltage. The voltage monitor comprises a second bandgap reference generation circuit that is configured to generate the reference voltage differently than the first band gap reference generation circuit is configured to generate the input voltage; a voltage divider configured to output a first distribution voltage based on the input voltage; and a monitoring circuit configured to output an alarm signal responsive to comparing a voltage level of the reference voltage with that of the input voltage, wherein the control logic circuit is configured to output a feedback signal to the voltage generator responsive to receiving the alarm signal.

According to an aspect of the present disclosure, a vehicle comprises a monitoring device configured to monitor driving data; a storage device; and an electronic control unit configured to perform a first write operation to write the driving data in the storage device, wherein the storage device is configured to generate an input voltage using a first bandgap reference generation circuit, to generate a reference voltage differently than the first bandgap reference generation circuit is used to generate the input voltage, and to provide a warning signal to the electronic control unit responsive to comparing the input voltage with the reference voltage, and the electronic control unit is configured to receive the warning signal and to perform a second write operation to again write the driving data in the storage device.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION OF EMBODIMENTS

Hereinafter, the embodiments according to the technical spirits of the present disclosure will be described with reference to the accompanying drawings.

Figure 1:
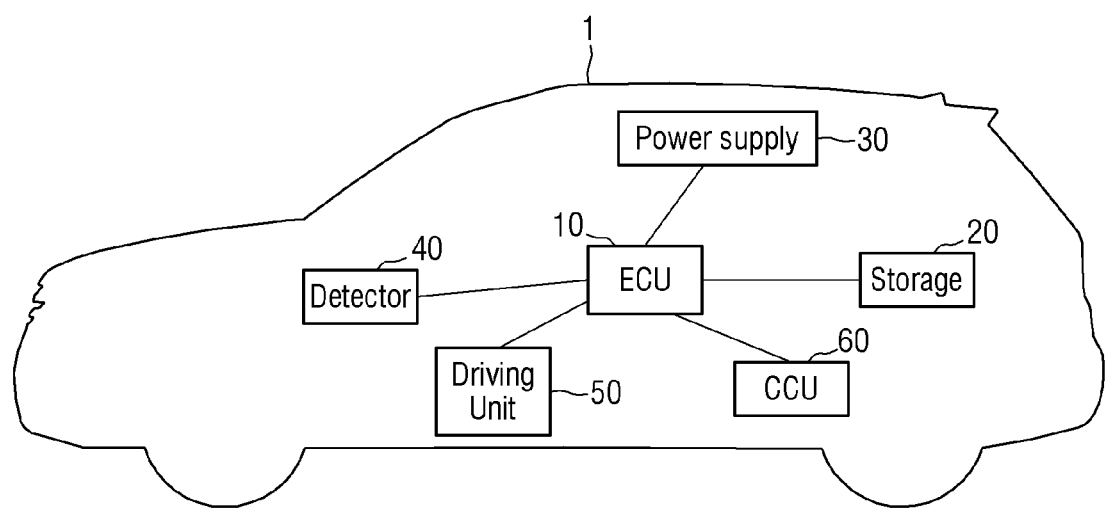
FIG. 1 is a block diagram illustrating a vehicle according to some embodiments.

FIG. 1 is a block diagram illustrating a vehicle according to some embodiments.

Referring to FIG. 1, a vehicle 1 may include an electronic control unit (ECU) 10, a storage device 20, a power supply 30, a detector 40, a driving unit 50, and a connectivity control unit (CCU) 60.

The electronic control unit 10 may be electrically, mechanically, and communicatively connected to at least one device of a plurality of devices provided in the vehicle 10, and may control an operation of at least one device based on one or more function execution commands. In this case, the plurality of devices may include a storage device 20, a power supply 30, a detector 40 for acquiring information required for performing at least one function, and a driving unit 50 for performing at least one function.

The storage device 20 may include a storage device for storing data required for driving. The storage device 20 will be described in detail with reference to FIG. 2.

The power supply 30 generates and supplies a power required for the operation of the plurality of devices provided in the vehicle 10. The power supply 30 may include a generator, a battery, and the like.

The detector 40 may include various detection units and image sensing units, and the driving unit 50 may include a fan and a compressor of an air conditioner, a fan of a ventilation device, an engine and a motor of a power device, a motor of a steering device, a motor and a valve of a braking device, a switching device of a door or a tail gate, and the like.

The electronic control unit 10 may perform communication with the detector 40 and the driving unit 50 using at least one of Ethernet, low voltage differential signal (LVDS) communication, or Local Interconnect Network (LIN) communication.

The electronic control unit 10 may determine whether to perform a function based on the information acquired through the detector 40, and when it is determined that the function should be performed, the electronic control unit may control the operation of the driving unit 50, which performs the corresponding function. In this case, the electronic control unit 10 may control the amount of the operation of the driving unit 50 based on the acquired information. At this time, the electronic control unit 10 may store the acquired information in the storage device 20 or read and use information stored in the storage device 20. When a temperature of the vehicle 1 gets out of or is outside of a predetermined range or a change in a voltage provided to the storage device 20 gets out of or is outside of a predetermined range, the electronic control unit 10 and the storage device 20 may change a preset range through the above-described operation.

The electronic control unit 10 may include a plurality of electronic control units, and each of the electronic control units 10 may independently control any one function, or may be associated with another electronic control unit to control any one function.

For example, when a distance from an obstacle detected through a distance detector is within a reference distance, an electronic control unit of a collision avoidance system may output a warning sound for the collision with the obstacle through a speaker.

An electronic control unit of an autonomous driving control system may be associated with an electronic control unit of a vehicle terminal, an electronic control unit of an image acquisition module, and/or an electronic control unit of the collision avoidance system to receive navigation information, road image information and/or distance information from the obstacle and control the power device, the braking device and/or the steering device using the received information, thereby performing autonomous driving.

A connectivity control unit (CCU) 60 is electrically, mechanically, communicatively connected with the electronic control unit 10, and performs communication with electronic control unit 10.

That is, the connectivity control unit 60 may directly perform communication with the electronic control unit 10 provided inside the vehicle, may perform communication with an external server, and/or may perform communication with an external terminal through an interface.

The connectivity control unit 60 may perform communication with the electronic control unit 10, and may perform communication with an external server (not shown) through an antenna (not shown) and RF communication.

In addition, the connectivity control unit 60 may perform communication with the external server through wireless communication. The wireless communication between the connectivity control unit 60 and the external server is possible through various wireless communication modes such as Global System for Mobile Communication (GSM), Code Division Multiple Access (CDMA), Wideband Code Division Multiple Access (WCDMA), Universal Mobile Telecommunications System (UMTS), Time Division Multiple Access System (TDMA) and Long Term Evolution System (LTE), in addition to a Wi-Fi module and a wireless broadband (WiBro) module.

Figure 2:
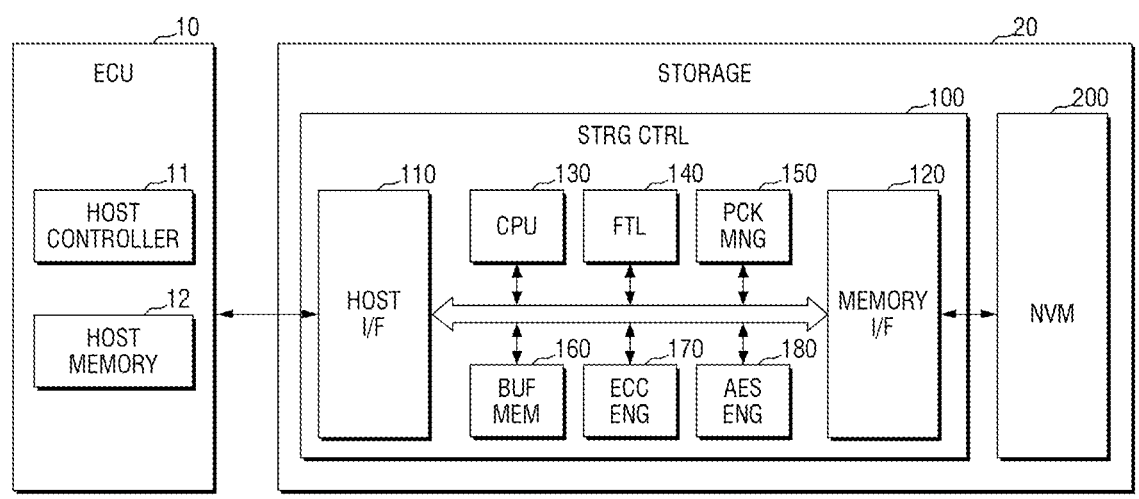
FIG. 2 is a block diagram illustrating an electronic control unit and a storage device or system that may be used in the vehicle of FIG. 1.

FIG. 2 is a block diagram illustrating an electronic control unit and a storage device or system of FIG. 1.

Referring to FIG. 2, the electronic control unit and the storage system may include an electronic control unit 10 and a storage device 20. The storage device 20 may include a storage controller 100 and a nonvolatile memory (NVM) 200. In addition, in accordance with an example embodiment of the present disclosure, the electronic control unit 10 may include a host controller 11 and a host memory 12. The host memory 12 may function as a buffer memory for temporarily storing data to be transmitted to the storage device 20 or data transmitted from the storage device 20.

The storage device 20 may include storage media for storing data in accordance with a request from the electronic control unit 10. As an example, the storage device 20 may include at least one of a solid state drive (SSD), an embedded memory, or a detachable external memory. When the storage device 20 is an SSD, the storage device 20 may be a device that complies with the nonvolatile memory express (NVMe) standard. When the storage device 20 is an embedded memory or external memory, the storage device 20 may be a device that complies with the universal flash storage (UFS) or embedded multi-media card (eMMC) standard. Each of the electronic control unit 10 and the storage device 20 may generate and transmit packets according to a standard protocol that is employed.

When the nonvolatile memory 200 of the storage device 20 includes a flash memory, the flash memory may include a 2D NAND memory array or a 3D (or perpendicular or vertical) NAND (VNAND) memory array. As another example, the storage device 20 may include other various types of nonvolatile memories. For example, a magnetic random access memory (MRAM), a spin-transfer torque MRAM, a Conductive Bridging RAM (CBRAM), a Ferroelectric RAM (FeRAM), a Phase RAM (PRAM), a Resistive RAM and other various types of memories may be applied to the storage device 20.

In accordance with some embodiments, the host controller 11 and the host memory 12 may be implemented as a separate semiconductor chip. Alternatively, in some embodiments, the host controller 11 and the host memory 12 may be integrated into the same semiconductor chip. As an example, the host controller 11 may be any of a plurality of modules provided in an application processor, and the application processor may be implemented as a system on chip (SoC). In addition, the host memory 12 may be an embedded memory provided in the application processor, or may be a nonvolatile memory or memory module disposed outside the application processor.

The host controller 11 may store data (e.g., write data) of a buffer area of the host memory 12 in the nonvolatile memory 200, or may manage an operation of storing data (e.g., read data) of the nonvolatile memory 200 in the buffer area.

The storage controller 100 may include a host interface 110, a memory interface 120, and a central processing unit (CPU) 130. The storage controller 100 may further include a flash translation layer (FTL) 140, a packet manager 150, a buffer memory 160, an error correction code (ECC) engine 170, and an advanced encryption standard (AES) engine 180. The storage controller 100 may further include a working memory (not shown) in which the flash translation layer (FTL) 140 is loaded, and the CPU 130 may control a data write and read operation for the nonvolatile memory 200 by executing the flash translation layer.

The host interface 110 may transmit and receive packets to and from the electronic control unit 10. The packet transmitted from the electronic control unit 10 to the host interface 110 may include a command or data to be written in the nonvolatile memory 200, and the packet transmitted from the host interface 110 to the electronic control unit 10 may include a response to the command or data read from the nonvolatile memory 200. The memory interface 120 may transmit the data to be written in the nonvolatile memory 200 to the nonvolatile memory 200, or may receive the data read from the nonvolatile memory 300. Such a memory interface 120 may be implemented to comply with standard regulations such as Toggle or Open NAND Flash Interface (ONFI).

The flash translation layer 140 may perform various functions, such as address mapping, wear-leveling, and garbage collection. The address mapping operation is an operation of changing a logical address received from the electronic control unit 10 to a physical address used to actually store data in the nonvolatile memory 200. The wear-leveling is a technique for preventing excessive degradation of a specific block by allowing blocks in the nonvolatile memory 200 to be uniform, and may exemplarily be implemented through firmware technology for balancing erase counts of physical blocks. The garbage collection is a technique for securing the available capacity in the nonvolatile memory 200 by copying valid data of a block to a new block and erasing the existing block.

The packet manager 150 may generate a packet according to a protocol of an interface negotiated with the electronic control unit 10, or may parse various types of information from the packet received from the electronic control unit 10. The buffer memory 160 may temporarily store the data to be written in the nonvolatile memory 200 or the data to be read from the nonvolatile memory 200. The buffer memory 160 may be provided in the storage controller 100, but may be disposed outside the storage controller 100.

The ECC engine 170 may perform error detection and correction functions for the read data read from the nonvolatile memory 200. In more detail, the ECC engine 170 may generate parity bits for the write data to be written in the nonvolatile memory 200, and the generated parity bits may be stored in the nonvolatile memory 200 together with the write data. When reading the data from the nonvolatile memory 200, the ECC engine 170 may correct an error of the read data using the parity bits read from the nonvolatile memory 200 together with the read data, and may output the error-corrected read data.

The AES engine 180 may perform at least one of an encryption operation or a decryption operation for data input to the storage controller 100 using a symmetric-key algorithm.

Figure 3:
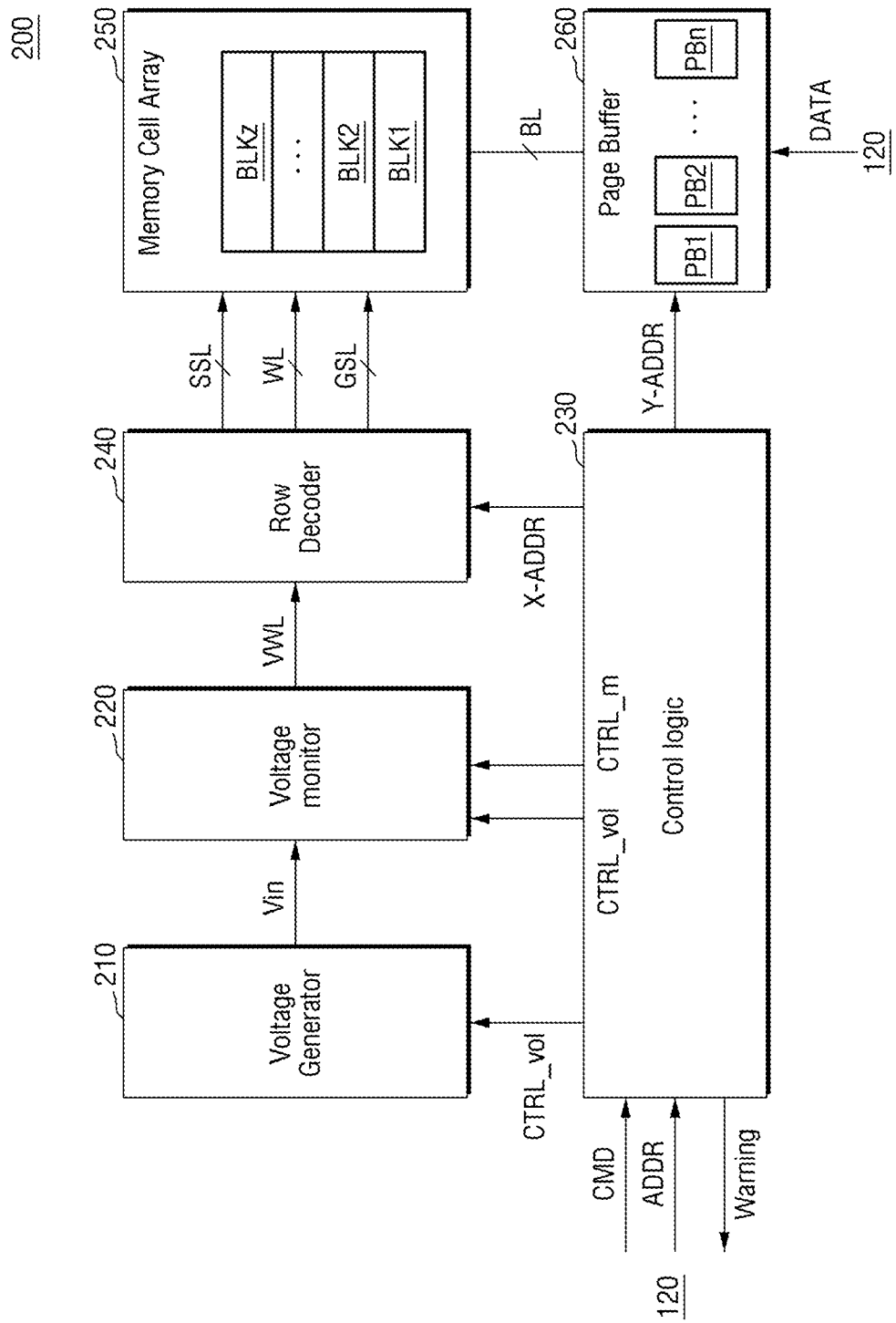
FIG. 3 is a block diagram illustrating a memory system according to some embodiments.

FIG. 3 is a block diagram illustrating a memory system according to some embodiments.

Referring to FIG. 3, the nonvolatile memory 200 may include a voltage generator 210, a voltage monitor 220, a control logic circuit 230, a row decoder 240, a memory cell array 250, and a page buffer 260. Although not shown in FIG. 3, the nonvolatile memory 200 may further include a memory interface 120 shown in FIG. 3, and may further include a column logic, a pre-decoder, a temperature sensor, a command decoder, an address decoder, and the like.

The voltage generator 210 may generate various types of voltages for performing program, read and erase operations based on a voltage control signal CTRL_vol. For example, the voltage generator 210 may generate a program voltage, a read voltage, a program verification voltage, an erase voltage, and the like as word line voltages VWL.

The voltage monitor 220 may monitor an input voltage Vin based on the voltage control signal CTRL_vol and a monitoring control signal CTRL_m to output an alarm signal ALARM and a word line voltage VWL.

The control logic circuit 230 may generally control various operations within the nonvolatile memory 200. The control logic circuit 230 may output various control signals in response to a command CMD and/or an address ADDR from the memory interface 120. For example, the control logic circuit 230 may output the voltage control signal CTRL_vol, the monitoring control signal CTRL_m, a warning signal, a row address X-ADDR and a column address Y-ADDR.

The row decoder 240 may select one of a plurality of word lines WL in response to the row address X-ADDR, and may select one of a plurality of string selection lines SSL. For example, the row decoder 240 may apply the program voltage and the program verification voltage to the selected word line during a program operation, and may apply a read voltage to the selected word line during a read operation.

The memory cell array 250 may include a plurality of memory blocks BLK1 to BLKz (z is a positive integer), and each of the plurality of memory blocks BLK1 to BLKz may include a plurality of memory cells. The memory cell array 250 may be connected to the page buffer 260 through bit lines BL, and may be connected to the row decoder 240 through the word lines WL, the string selection lines SSL and ground selection lines GSL.

In an example embodiment, the memory cell array 250 may include a three-dimensional memory cell array, and the three-dimensional memory cell array may include a plurality of NAND strings. Each NAND string may include memory cells respectively connected to word lines vertically deposited on a substrate. U.S. Pat. Nos. 7,679,133, 8,553,466, 8,654,587, 8,559,235, and U.S. Patent Application Publication No. 2010/0233648 are incorporated herein by reference. In an example embodiment, the memory cell array 250 may include a two-dimensional memory cell array, and the two-dimensional memory cell array may include a plurality of NAND strings disposed along row and column directions.

The page buffer 260 may include a plurality of page buffers PB1 to PBn, where n is an integer greater than or equal to 3, and a plurality of page buffers PB1 to PBn may respectively be connected with the memory cells through a plurality of bit lines BL. The page buffer 260 may select at least one of the bit lines BL in response to a column address Y-ADDR. The page buffer 260 may operate as a write driver or a sense amplifier depending on an operation mode. For example, during the program operation, the page buffer 260 may apply a bit line voltage corresponding to data to be programmed, to the selected bit line. During the read operation, the page buffer 260 may sense a current or voltage of the selected bit line and sense data stored in the memory cell.

Figure 4:
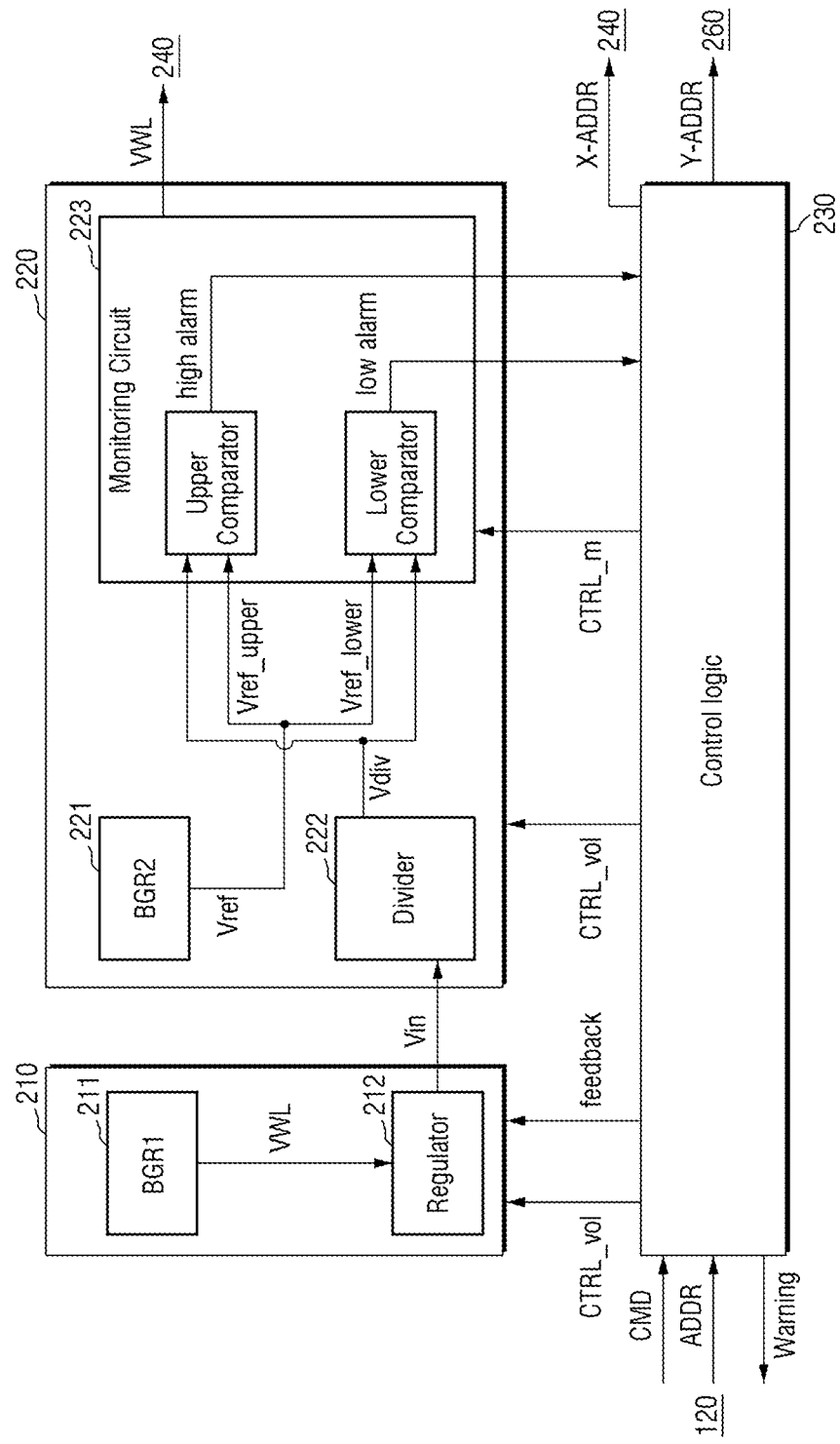
FIG. 4 is a block diagram illustrating an abnormal voltage monitoring device according to some embodiments.

FIG. 4 is a block diagram illustrating an abnormal voltage monitoring device according to some embodiments.

Referring to FIG. 4, the voltage generator 210 may include a first bandgap reference generation circuit 211 and a regulator 212. The first bandgap reference generation circuit 211 may generate a word line voltage VWL. The regulator 212 may electrically be connected with the first bandgap reference generation circuit 211 to receive and regulate the word line voltage VWL. The terms "first," "second," etc. may be used herein merely to distinguish one element from another.

The voltage monitor 220 may include a second bandgap reference generation circuit 221, a voltage divider 222, and a monitoring circuit 223. The second bandgap reference generation circuit 221 may generate a reference voltage Vref. The reference voltage Vref may include an upper limit reference voltage Vref_upper and a lower limit reference voltage Vref_lower having a voltage level lower than that of the upper limit reference voltage Vref_upper. The voltage divider 222 may electrically be connected with the voltage generator 210 to receive the input voltage Vin, thereby outputting a distribution voltage Vdiv. The monitoring circuit 223 may receive the distribution voltage Vdiv and the reference voltage Vref and monitor the distribution voltage Vdiv based on the monitoring control signal CTRL_m. The monitoring circuit 223 may output an alarm signal Alarm based on the monitoring result. The alarm signal may include a high alarm signal and a low alarm signal.

The voltage monitor 220 may be provided in the memory 200, or may be disposed outside the memory 200. In addition, the voltage monitor 220 may be separated from the voltage generator 210 and the control logic circuit 230, may be provided inside the voltage generator 210 or may be provided inside the control logic circuit 230.

The control logic circuit 230 may output a feedback signal in response to the alarm signal from the monitoring circuit 223 in addition to various control signals. Although not shown in FIG. 4, the feedback signal may include a high feedback signal and a low feedback signal.

Figure 5:
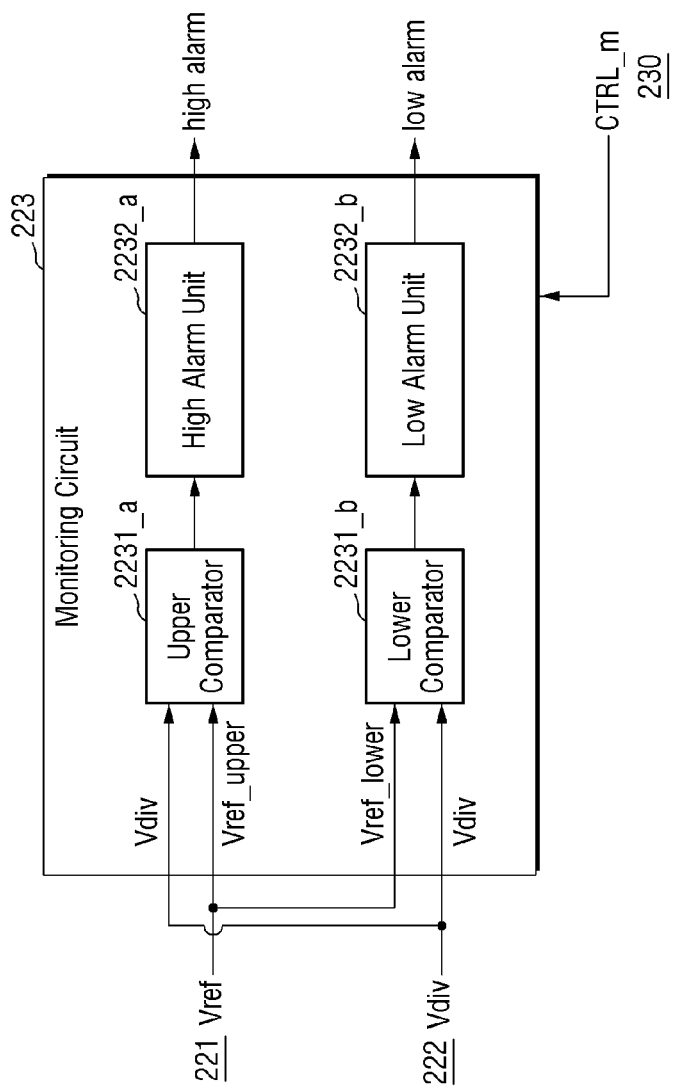
FIG. 5 is a block diagram illustrating a structure of the monitoring circuit of FIG. 4.

FIG. 5 is a block diagram illustrating a structure of the monitoring circuit of FIG. 4.

Referring to FIG. 5, the monitoring circuit 223 may include an upper comparator 2231_a, a lower comparator 2231_b, a high alarm unit 2232_a, and a low alarm unit 2232_b. Although not shown in FIG. 5, the monitoring circuit 223 may further include a level shifter (not shown), a buffer (not shown), and the like. Alternatively, the high alarm unit 2232_a or the low alarm unit 2232_b may further include a level shifter (not shown), a buffer (not shown), and the like.

Figure 6:
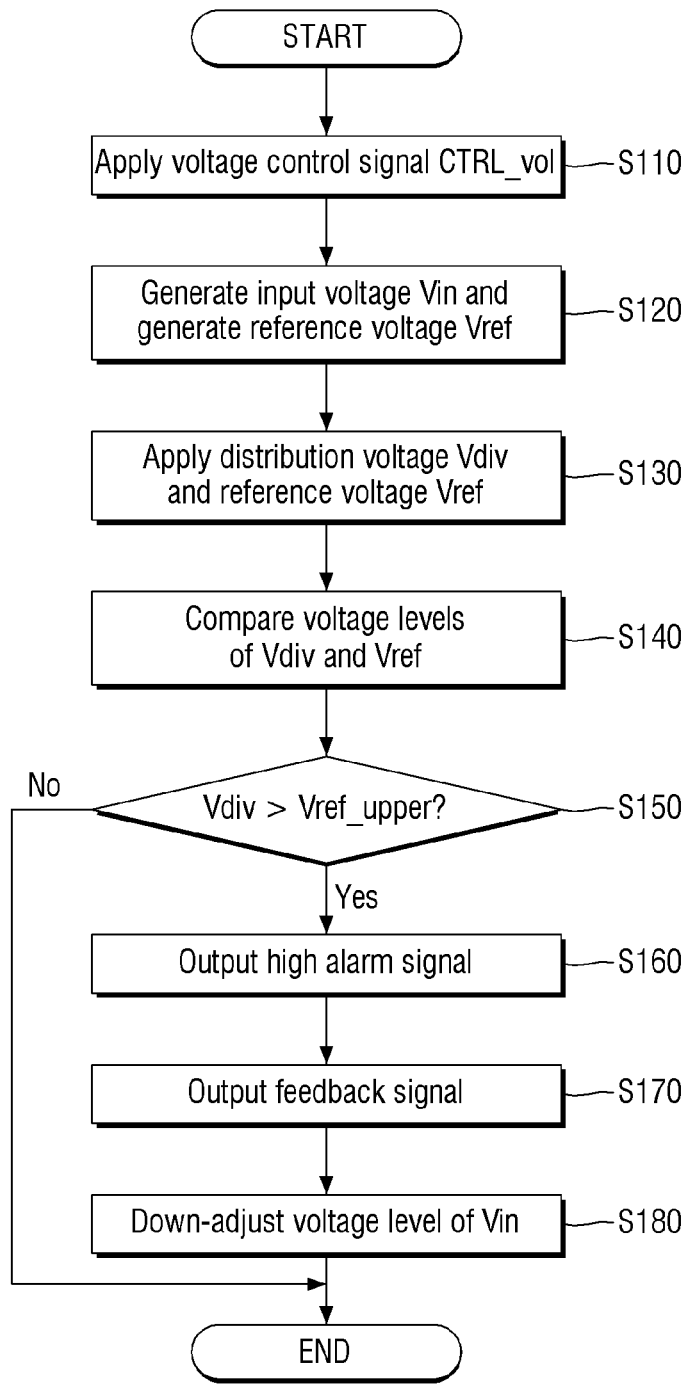
FIG. 6 is a flowchart illustrating a monitoring operation according to some embodiments.
Figure 7:
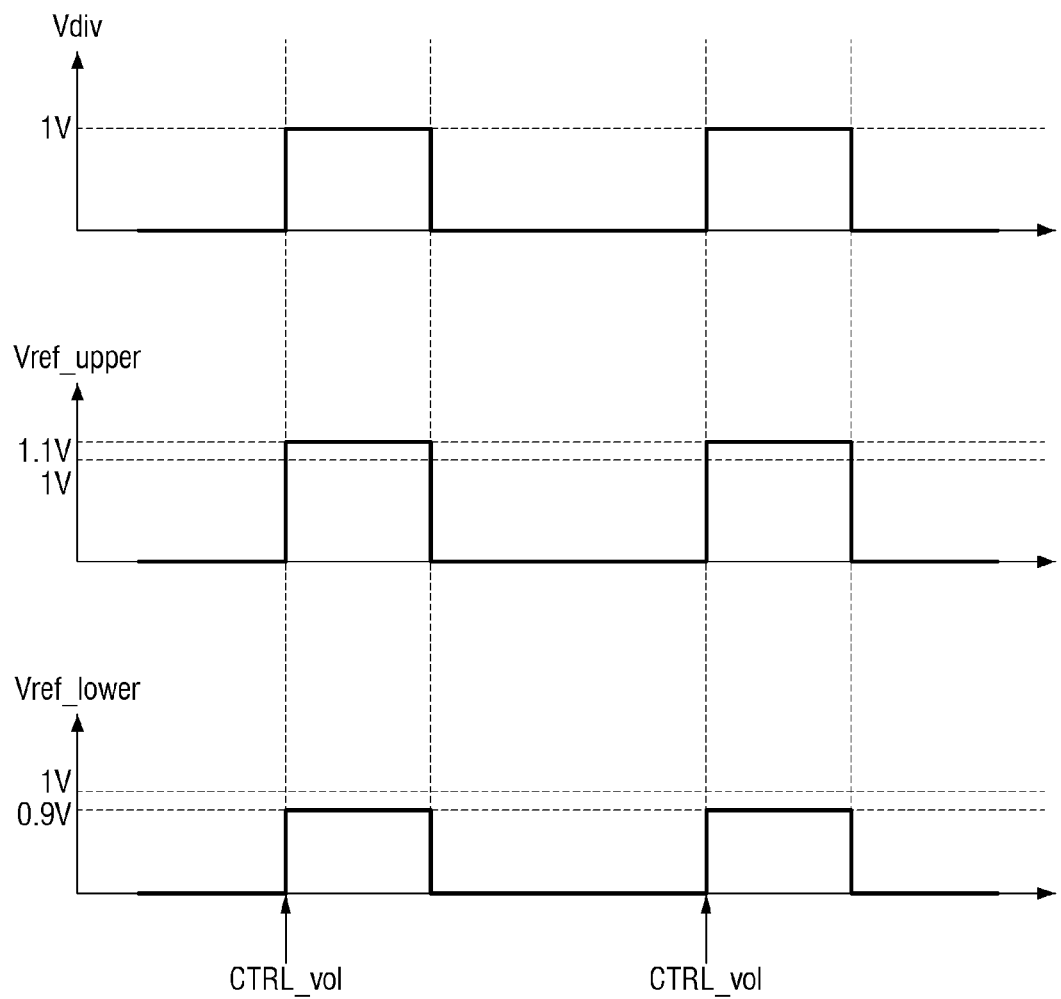
FIG. 7 is a diagram illustrating a monitoring operation of the monitoring circuit of FIG. 5.
Figure 8:
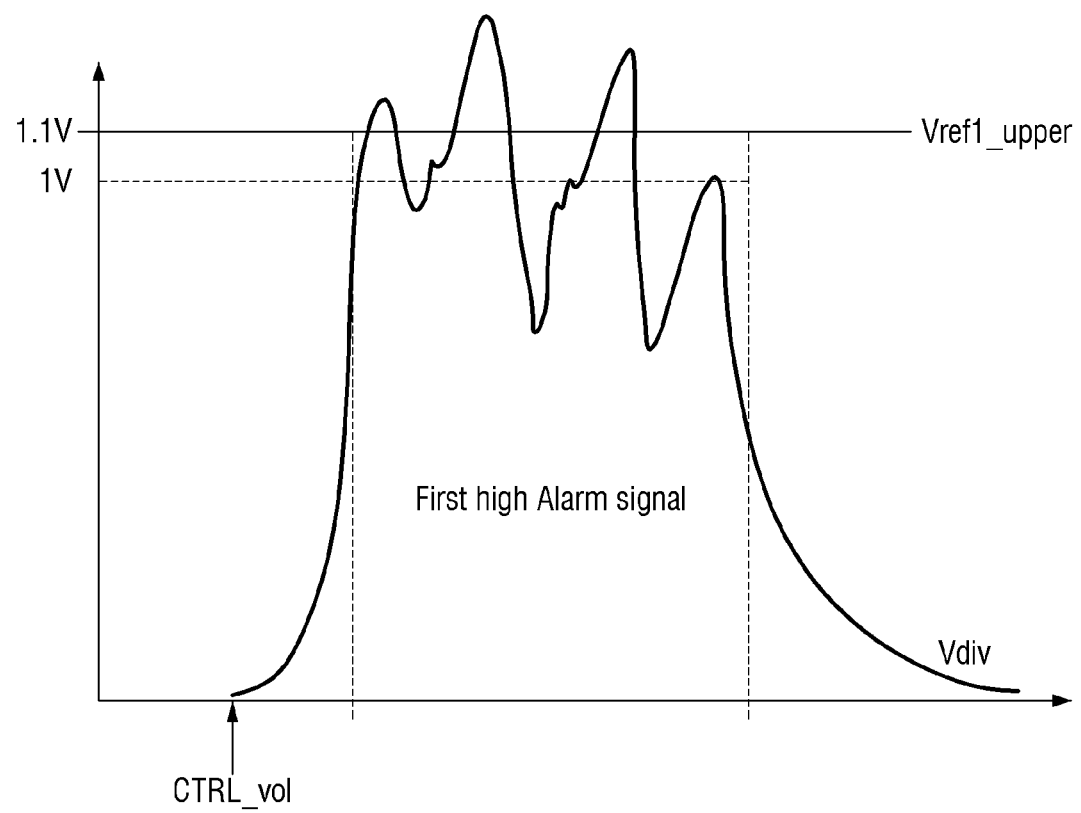
FIGS. 8 and 9 are enlarged diagrams illustrating application of a voltage control signal to the monitoring circuit in FIG. 7.
Figure 9:
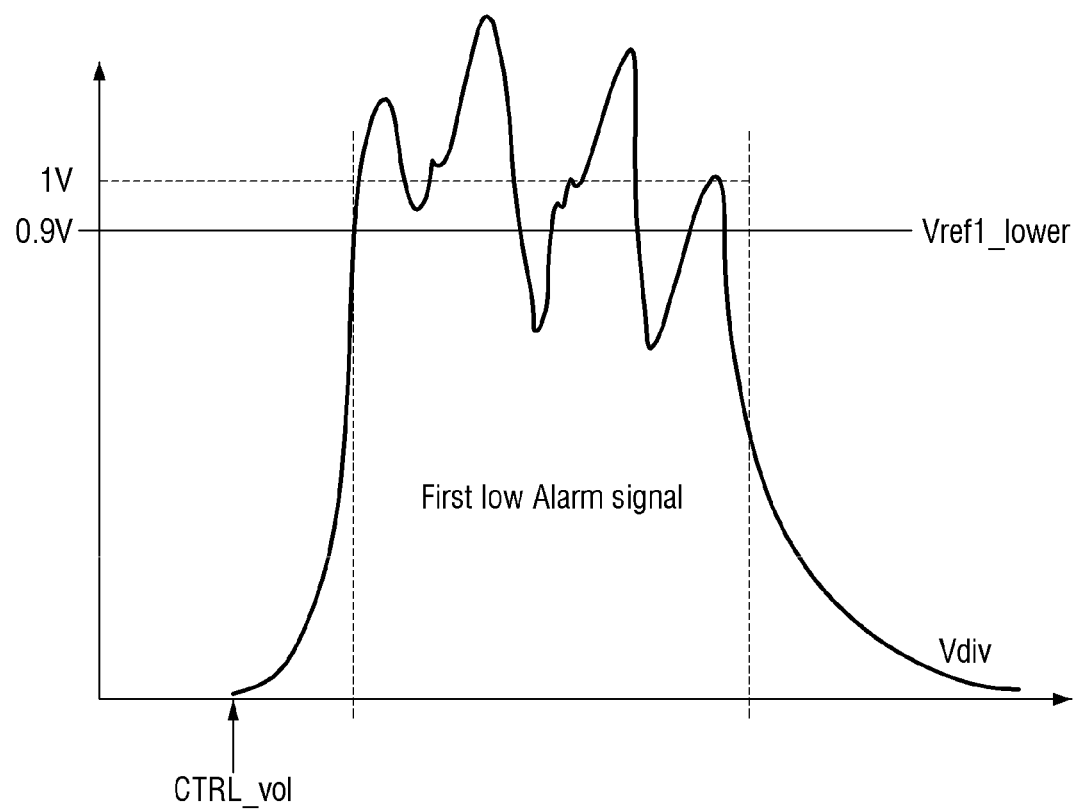

FIG. 6 is a flowchart illustrating a monitoring operation according to some embodiments. FIG. 7 is a diagram illustrating a monitoring operation of the monitoring circuit of FIG. 5. FIGS. 8 and 9 are enlarged diagrams illustrating that a voltage control signal is applied to the monitoring circuit in FIG. 7. Hereinafter, the monitoring operation according to some embodiments will be described in detail with reference to the accompanying drawings.

Referring to FIGS. 7 and 8, an x-axis may denote time, and a y-axis may denote the distribution voltage Vdiv and the reference voltage Vref. Referring to FIGS. 4 and 6 to 8, in step S110, the control logic circuit 230 may apply the voltage control signal CTRL_vol to the voltage generator 210 and the voltage monitor 220. The control logic circuit 230 may apply the monitoring control signal CTRL_m to the voltage monitor. In step S120, the first bandgap reference circuit 211 may generate the word line voltage VWL based on the voltage control signal CTRL_vol. The word line voltage VWL may include a program voltage, a read voltage, a program verification voltage, an erase voltage, and the like in response to the voltage control signal CTRL_vol. The word line voltage VWL may be equal to the input voltage Vin, and may be regulated by the regulator 212 and then converted to the input voltage Vin. The second bandgap reference circuit 221 may generate the reference voltage Vref based on the voltage control signal CTRL_vol. The reference voltage Vref may be a reference voltage corresponding to the word line voltage VWL based on the monitoring control signal CTRL_m. In step S130, the voltage divider 222 may receive the input voltage Vin from the voltage generator 210 and apply the distribution voltage Vdiv to the monitoring circuit 223. The second bandgap reference generation circuit 221 may apply the reference voltage Vref to the monitoring circuit 223. The reference voltage Vref may include an upper limit reference voltage Vref_upper and a lower limit reference voltage Vref_lower. Although FIGS. 7 and 8 show that the distribution voltage Vdiv is 1V and the upper limit reference voltage Vref_upper is 1.1V, the embodiments of the present disclosure are not limited thereto. Various voltage levels may be included in the distribution voltage and the upper limit reference voltage depending on commands (read, program, erase, etc.) applied to the device.

Referring to FIGS. 4 to 6, in step S140, the upper comparator 2231_a may compare the distribution voltage Vdiv with the upper limit reference voltage Vref_upper, and the lower comparator 2231_b may compare the distribution voltage Vdiv with the lower limit reference voltage Vref_lower. In step S150, whether the distribution voltage Vdiv has a voltage level higher than that of the upper limit reference voltage Vref_upper may be determined.

When the distribution voltage Vdiv has a voltage level higher than that of the upper limit reference voltage Vref_upper, the high alarm unit 2232_a may output a high alarm signal in step S160. When the voltage level of the distribution voltage Vdiv is equal to or lower than that of the upper limit reference voltage Vref_upper, the monitoring operation may be terminated without passing through steps S160 to S180.

In step 170, the control logic circuit 230 may receive a high alarm signal and output a feedback signal corresponding to the alarm signal. For example, the control logic circuit 230 may receive the high alarm signal and output a high feedback signal corresponding to the high alarm signal. In step S180, the voltage generator 210 may receive the high feedback signal to perform trimming for a level of the word line voltage VWL. For example, the voltage generator 210 may down-adjust the level of the word line voltage VWL in response to the high feedback signal.

Although FIG. 6 shows the distribution voltage Vdiv is compared with the upper limit reference voltage Vref_upper, the embodiments are not limited thereto. For example, the step S150 may include comparing the distribution voltage Vdiv with the lower limit reference voltage Vref_lower, and the steps S160 to S180 may further include a step corresponding thereto. Those skilled in the art may clearly understand the above description and FIGS. 4 to 7 and 9 even in the case that the distribution voltage is compared with the lower limit reference voltage.

As described above, after the voltage used for the operation of the semiconductor device such as the storage device mounted on the vehicle is monitored, when the input voltage gets out of or is outside of a normal voltage range, this status is monitored and the alarm signal is output. The voltage generator performs trimming for the voltage level based on the feedback signal, whereby the probability of occurrence of a defect on the operation of the semiconductor device may be lowered.

Figure 10:
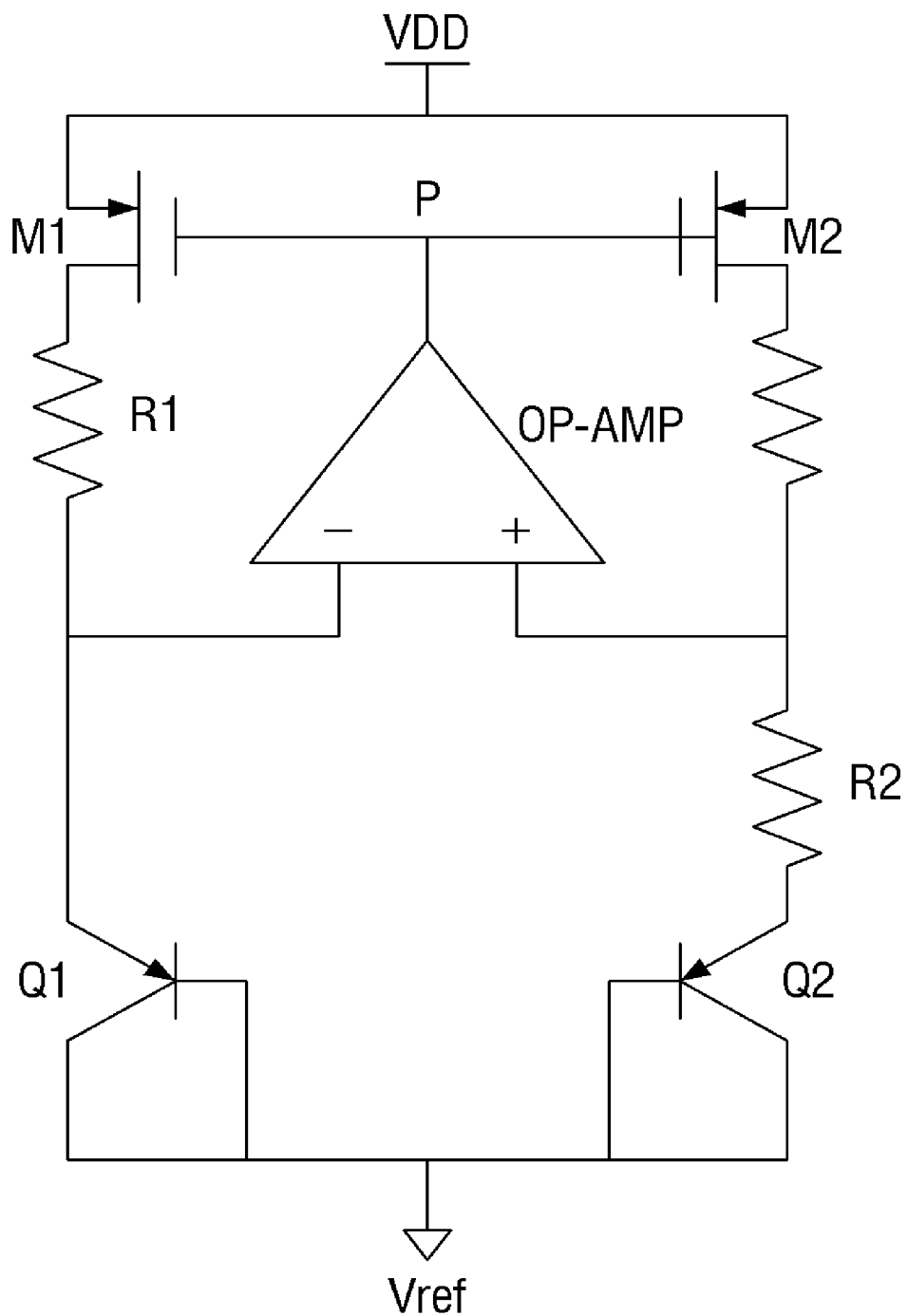
FIGS. 10 and 11 are circuit diagrams illustrating a bandgap reference generation circuit according to some further embodiments of the present disclosure.
Figure 11:
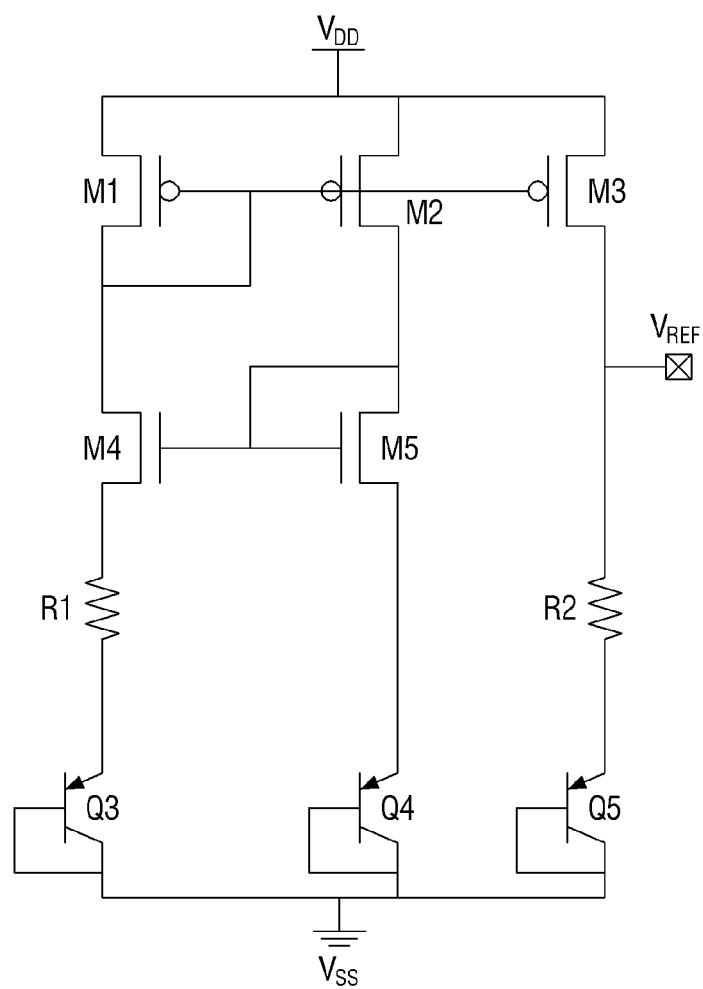

The abnormal voltage monitoring device according to some further embodiments will be described with reference to FIGS. 4 and 10 to 11. FIGS. 10 and 11 are circuit diagrams illustrating a bandgap reference generation circuit according to some further embodiments of the present disclosure.

Referring to FIG. 4, the first bandgap reference generation circuit 211 and the second bandgap reference generation circuit 221 may generate voltages in respective ways that are different from each other.

Referring to FIGS. 4 and 10, in some embodiments, the first bandgap reference generation circuit 211 of the abnormal voltage monitoring device may generate the word line voltage VWL using an operational amplifier OP-AMP, and the second bandgap reference generation circuit 221 may generate the reference voltage Vref without using the operational amplifier. In detail, in some embodiments, an example circuit includes elements M1, M2, OP-AMP, R2, Q1, and Q2. The first bandgap reference generation circuit 211 may generate the word line voltage VWL using the operational amplifier, and the second bandgap reference generation circuit 221 may generate the reference voltage Vref using a current mirror. In more detail, referring to FIG. 10, a size ratio of a first Bipolar Junction Transistor (BJT) Q1 to a second BJT Q2 may be 1:11.

Referring to FIGS. 4 and 11, in some further embodiments, the first bandgap reference generation circuit 211 may generate the word line voltage VWL using the current mirror, and the second bandgap reference generation circuit 221 may generate the reference voltage Vref without using the current mirror. In detail, an example circuit includes elements M1, M2, M3, M4, M5, R1, R2, Q3, Q4, and Q5. The first bandgap reference generation circuit 211 may generate the word line voltage VWL using the current mirror, and the second bandgap reference generation circuit 221 may generate the reference voltage Vref using the operational amplifier. In more detail, referring to FIG. 11, a size ratio of a third BJT Q3 to a fourth BJT Q4 may be 1:8.

The abnormal voltage monitoring device of FIGS. 10 and 11 may be similar to the abnormal voltage monitoring device of FIG. 4 in its configuration except for the first bandgap reference generation circuit 211 and the second bandgap reference generation circuit 221. In addition, the abnormal voltage monitoring device of FIGS. 10 and 11 may operate similarly to the operation of the abnormal voltage monitoring device of FIG. 6.

As described above, when the abnormal voltage monitoring device generates the input voltage and the reference voltage using the bandgap reference generation circuits having their respective structures different from each other, the probability of a defect on the operation may be lowered. When the input voltage Vin and the reference voltage Vref are generated using the bandgap reference generation circuits having the same structure, and a defect occurs in the bandgap reference generation circuit, the word line voltage VWL and the reference voltage Vref may all or both get out of a normal voltage level range. However, when the word line voltage VWL and the reference voltage Vref are generated using the bandgap reference generation circuits having different structures from each other, even if the word line voltage VWL gets out of or is outside of the normal voltage level range due to occurrence of a defect in the first bandgap reference generation circuit 211 as an example, an abnormal voltage may be monitored by the monitoring operation to adjust the word line voltage VWL as described above, whereby the storage device normally operates. Therefore, when the word line voltage VWL and the reference voltage Vref are generated using the bandgap reference generation circuits having different structures from each other, the probability of a defect on the operation of the device is lower than the case that the voltages are generated using the bandgap reference generation circuits having the same structure.

The abnormal voltage monitoring device according to some further embodiments of the present disclosure will be described with reference to FIGS. 12 and 13, and its description will be based on a difference from FIGS. 4 and 5.

Figure 12:
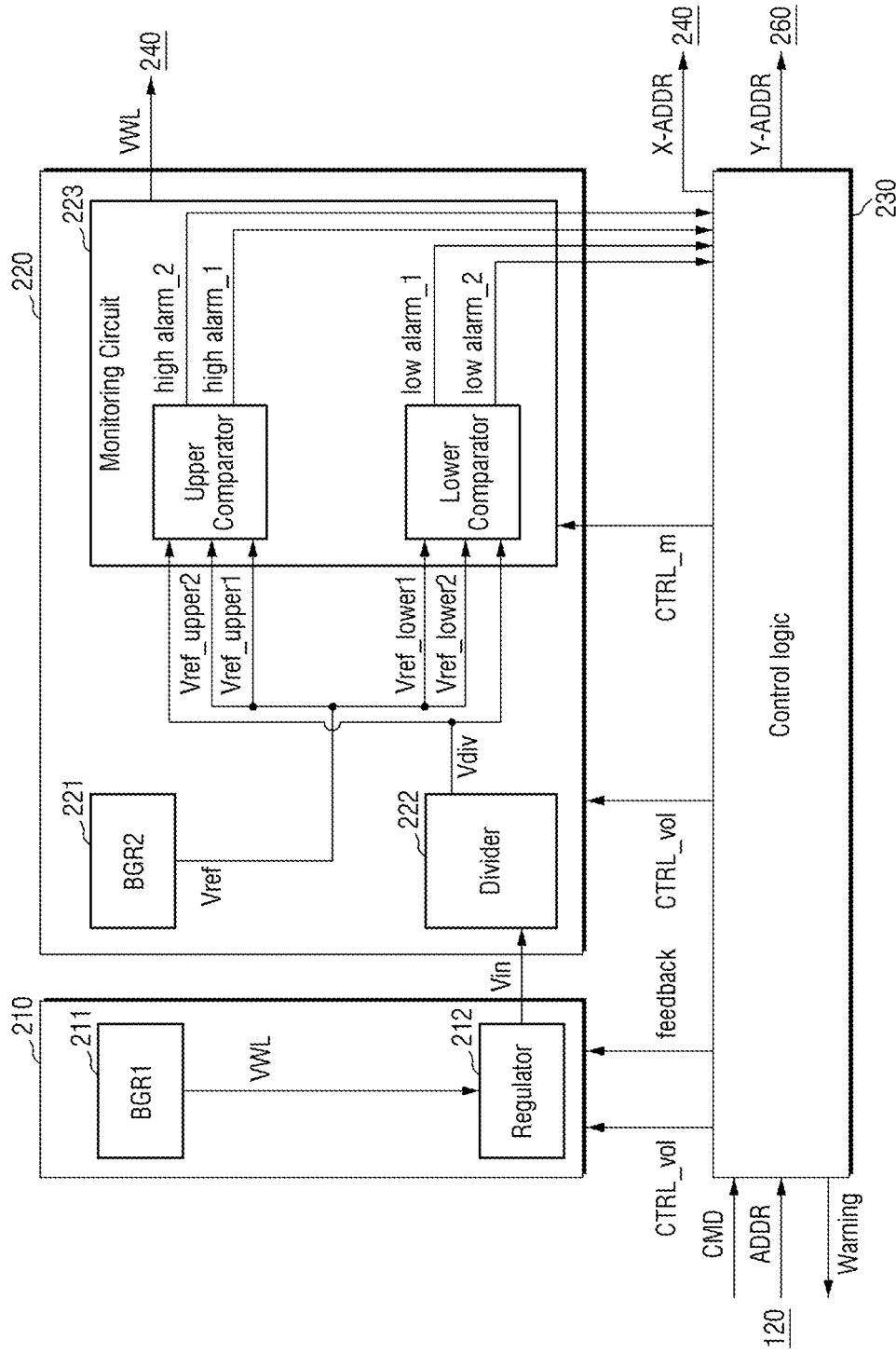
FIG. 12 is a block diagram illustrating an abnormal voltage monitoring device according to some further embodiments of the present disclosure.

FIG. 12 is a block diagram illustrating an abnormal voltage monitoring device according to some further embodiments of the present disclosure. FIG. 13 is a block diagram illustrating a structure of the monitoring circuit of FIG. 12.

Figure 13:
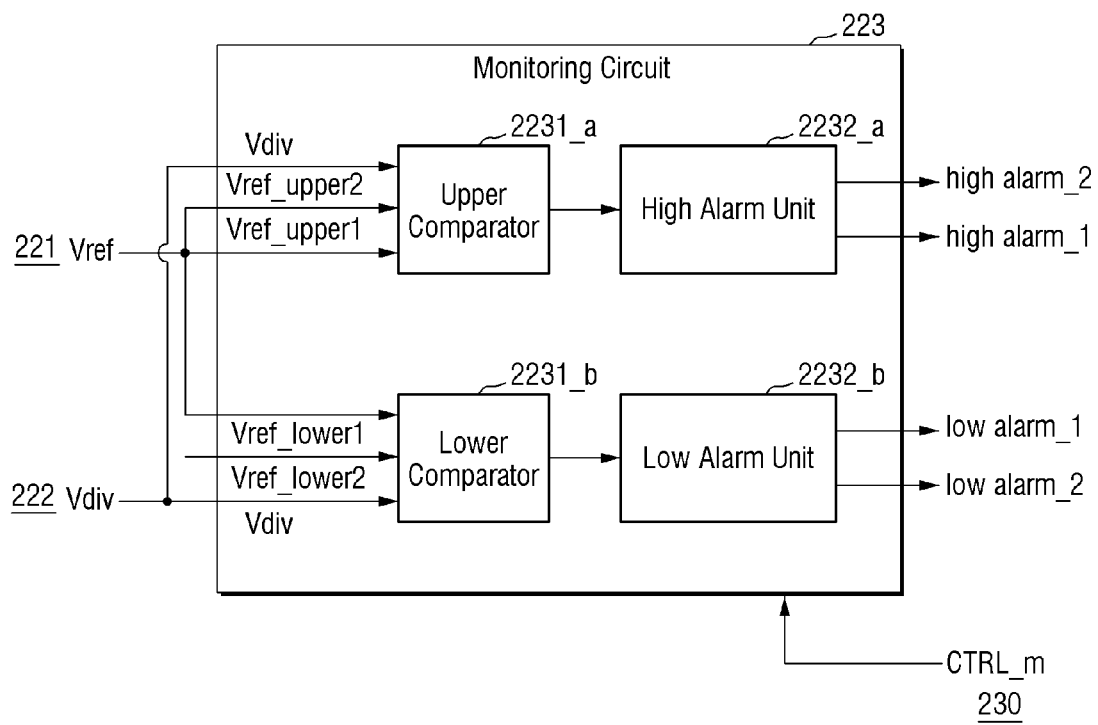
FIG. 13 is a block diagram illustrating a structure of the monitoring circuit of FIG. 12.

Referring to FIGS. 12 and 13, the reference voltage Vref may include an upper limit reference voltage Vref_upper and a lower limit reference voltage Vref_lower having a voltage level lower than that of the upper limit reference voltage Vref_upper. The upper limit reference voltage Vref_upper may include a first upper limit reference voltage Vref_upper1 and a second upper limit reference voltage Vref_upper2 having a voltage level higher than that of the first upper limit reference voltage Vref_upper1 (with associated alarm signals high alarm_1 and high alarm_2), and the lower limit reference voltage Vref_lower may include a first lower limit reference voltage Vref_lower1 and a second lower limit reference voltage Vref_lower2 having a voltage level lower than that of the first lower limit reference voltage Vref_lower1 (with associated alarm signals low alarm_1 and low alarm_2).

Although FIGS. 12 and 13 show that each of the upper/lower limit reference voltages includes two reference voltages, the embodiments are not limited thereto. For example, the upper limit reference voltage Vref_upper may include a first upper limit reference voltage Vref_upper1, a second upper limit reference voltage Vref_upper2 having a voltage level higher than that of the first upper limit reference voltage Vref_upper1, . . . , an nth upper limit reference voltage Vrefn_upper having a voltage level higher than that of an (n−1)th lower limit reference voltage. Likewise, the lower limit reference voltage Vref_lower may include a first lower limit reference voltage Vref_lower1, a second lower limit reference voltage Vref_lower2 having a voltage level lower than that of the first lower limit reference voltage Vref_lower1, . . . , an nth lower limit reference voltage Vrefn_lower having a voltage level lower than an (n−1)th lower limit reference voltage (n is a natural number of 2 or more).

Figure 14:
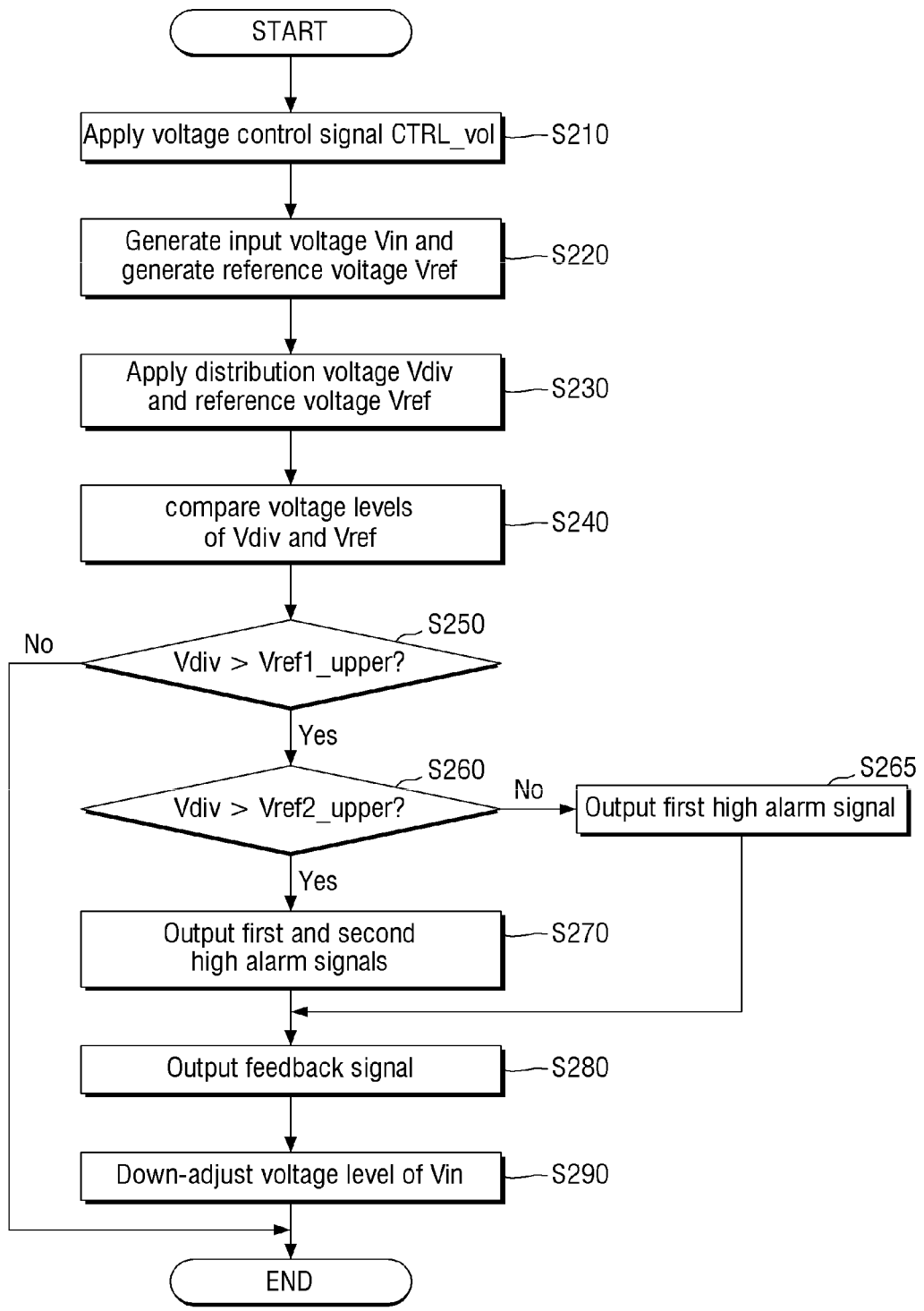
FIG. 14 is a flowchart illustrating a monitoring operation according to still some further embodiments.
Figure 15:
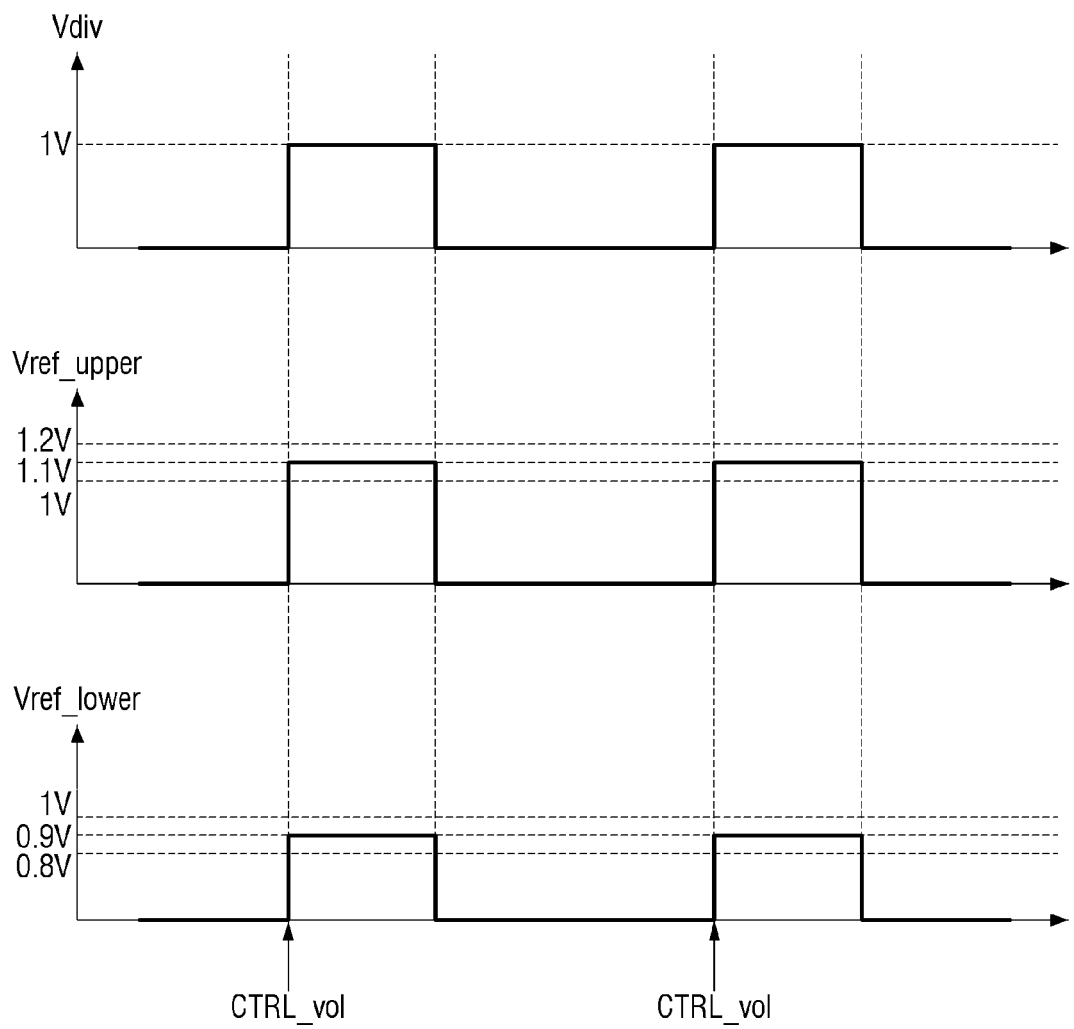
FIG. 15 is a diagram illustrating a monitoring operation of the monitoring circuit of FIG. 13.
Figure 16:
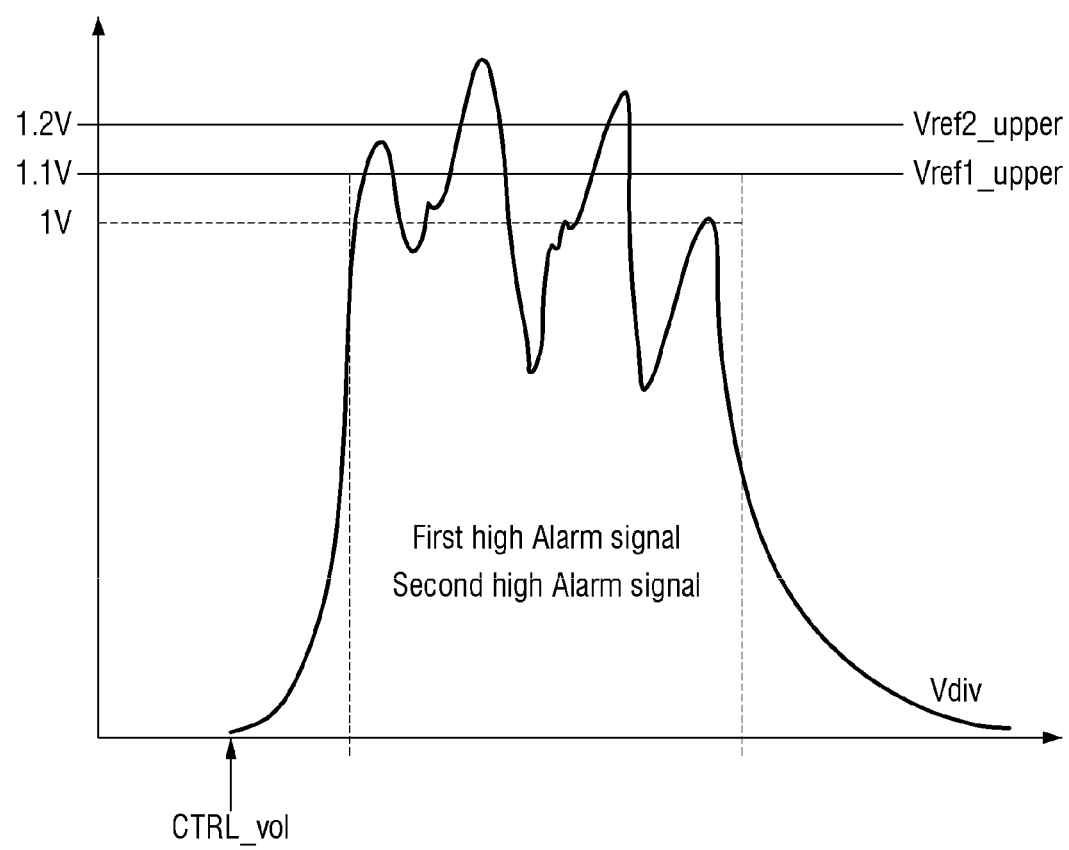
FIGS. 16 and 17 are enlarged diagrams illustrating application of a voltage control signal to the monitoring circuit in FIG. 15.
Figure 17:
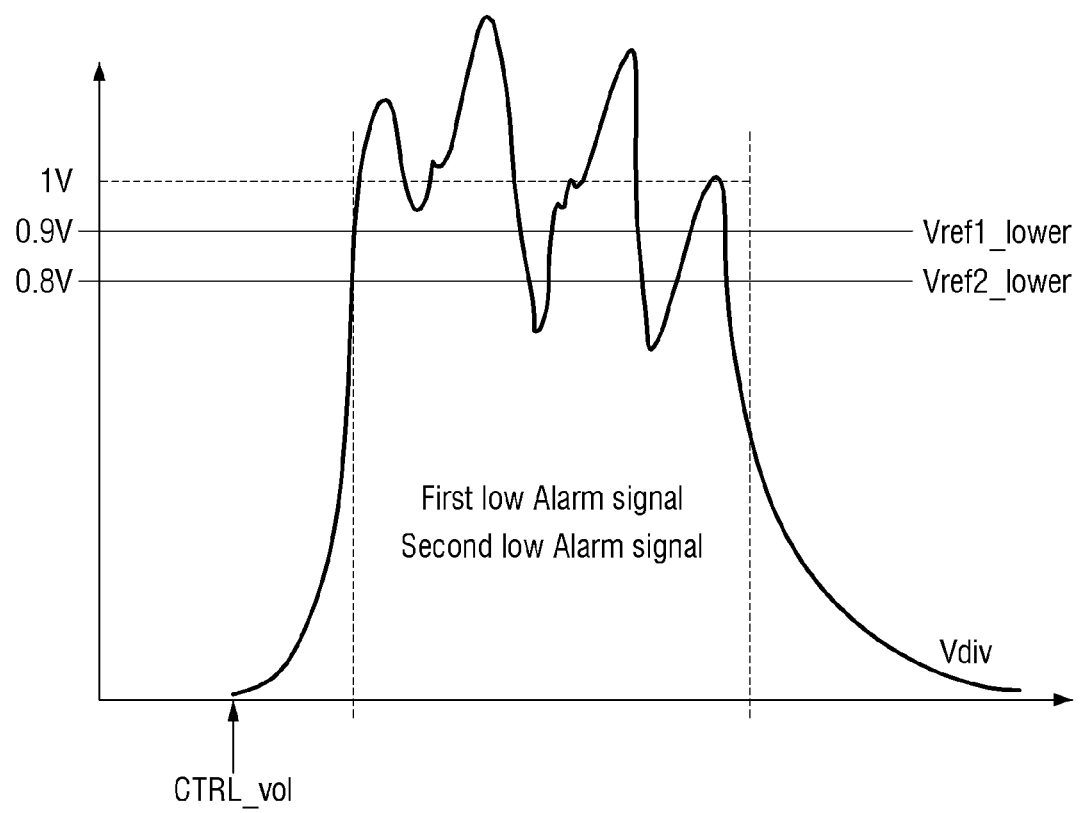

FIG. 14 is a flowchart illustrating a monitoring operation according to still some further embodiments. FIG. 15 is a diagram illustrating a monitoring operation of the monitoring circuit of FIG. 13. FIGS. 16 and 17 are enlarged diagrams illustrating that a voltage control signal is applied to the monitoring circuit in FIG. 15. The embodiments of FIGS. 14 to 17 will be described based on a difference from FIGS. 6 to 9. Steps S210, S220, S230, S240, S250, S270, S280 and S290 may be similar to the steps S110, S120, S130, S140, S150, S170, S170 and S180, respectively.

Referring to FIGS. 15 and 16, an x-axis may denote time, and a y-axis may denote the distribution voltage Vdiv and the reference voltage Vref. Referring to FIGS. 12 and 14 to 16, in step S220, the second bandgap reference circuit 221 may generate the reference voltage Vref based on the voltage control signal CTRL_vol. The reference voltage Vref may be a reference voltage corresponding to the word line voltage VWL based on the monitoring control signal CTRL_m. In step S230, the reference voltage Vref may include one or more upper limit reference voltages Vref_upper and one or more lower limit reference voltages Vref_lower. That is, the upper limit reference voltage Vref_upper may include a first upper limit reference voltage Vref_upper1, a second upper limit reference voltage Vref_upper2, . . . , an nth upper limit reference voltage Vrefn_upper, and the lower limit reference voltage Vref_lower may include a first lower limit reference voltage Vref_lower1, a second lower limit reference voltage Vref_lower2, . . . , an nth lower limit reference voltage Vrefn_lower (n is a natural number of 2 or more).

In step S240, the upper comparator 2231_a may compare the distribution voltage Vdiv with each of the plurality of upper limit reference voltages Vref_upper1, . . . , Vrefn_upper, and the lower comparator 2231_b may compare the distribution voltage Vdiv with each of the plurality of lower limit reference voltages Vref_lower1, . . . , Vrefn_lower.

Referring to FIGS. 12 to 14, whether the distribution voltage Vdiv has a voltage level higher than that of the first upper limit reference voltage Vref_upper1 may be determined in step S250.

When the distribution voltage Vdiv has a voltage level higher than that of the first upper limit reference voltage Vref_upper1, whether the distribution voltage Vdiv has a voltage level higher than that of the second upper limit reference voltage Vref_upper2 may be determined in step S260. When the voltage level of the distribution voltage Vdiv is equal to or lower than that of the first upper limit reference voltage Vref_upper1, the monitoring operation may be terminated without passing through steps S260 to S290.

In the step S260, when the distribution voltage Vdiv has a voltage level higher than that of the second upper limit reference voltage Vref_upper2, the high alarm unit 2232_a may output a first high alarm signal high alarm_1 and a second high alarm signal high alarm_2 in step S270. When the voltage level of the distribution voltage Vdiv is equal to or lower than that of the second upper limit reference voltage Vref_upper2, the high alarm unit 2232_a may output the first high alarm signal high alarm_1 in step S265.

In step 280, the control logic circuit 230 may receive a high alarm signal and output a feedback signal corresponding to the alarm signal. For example, when the control logic circuit 230 receives the first high alarm signal, it may output a first high feedback signal. When the control logic circuit 230 receives the first and second high alarm signals, it may output a second high feedback signal. In step S290, the voltage generator 210 may receive the high feedback signal to perform trimming for the word line voltage VWL. For example, the voltage generator 210 may down-adjust the level of the word line voltage VWL in response to the first high feedback signal. Also, the voltage generator 210 may down-adjust the level of the word line voltage VWL in response to the second high feedback signal.

Although FIG. 14 shows the distribution voltage Vdiv is compared with the first and second upper limit reference voltages Vref_upper1 and Vref_upper2, the embodiments are not limited thereto. For example, the steps S250 and S260 may further include comparing the distribution voltage Vdiv with each of a third upper limit reference voltage Vref3_upper, . . . , an nth upper limit reference voltage Vrefn_upper (n is a natural number of 2 or more), and the steps S270 to S290 may further include a step corresponding thereto. Although FIG. 16 shows that the distribution voltage Vdiv is 1V, the first upper limit reference voltage Vref_upper1 is 1.1V, and the second upper limit reference voltage Vref_upper2 is 1.2V, the embodiments of the present disclosure are not limited thereto. Various voltage levels may be included in the distribution voltage and the first and second upper limit reference voltages depending on commands (read, program, erase, etc.) applied to the device.

As another example, the step S250 may further include comparing the distribution voltage Vdiv with the first lower limit reference voltage Vref_lower1, and the steps S260 to S290 may further include a step corresponding thereto (e.g., including further comparing the distribution voltage Vdiv with the second lower limit reference voltage Vref_lower2). Those skilled in the art may clearly understand the above description and FIGS. 12 to 15 and 17 even in the case that the distribution voltage is compared with the lower limit reference voltage(s).

When several upper/lower limit reference voltages are set as above, the level of the input voltage getting out of the normal voltage range may be monitored. Therefore, when an abnormal voltage is monitored, trimming may be performed for the voltage level more precisely than the case that the single upper/lower limit reference voltage is set.

Figure 18:
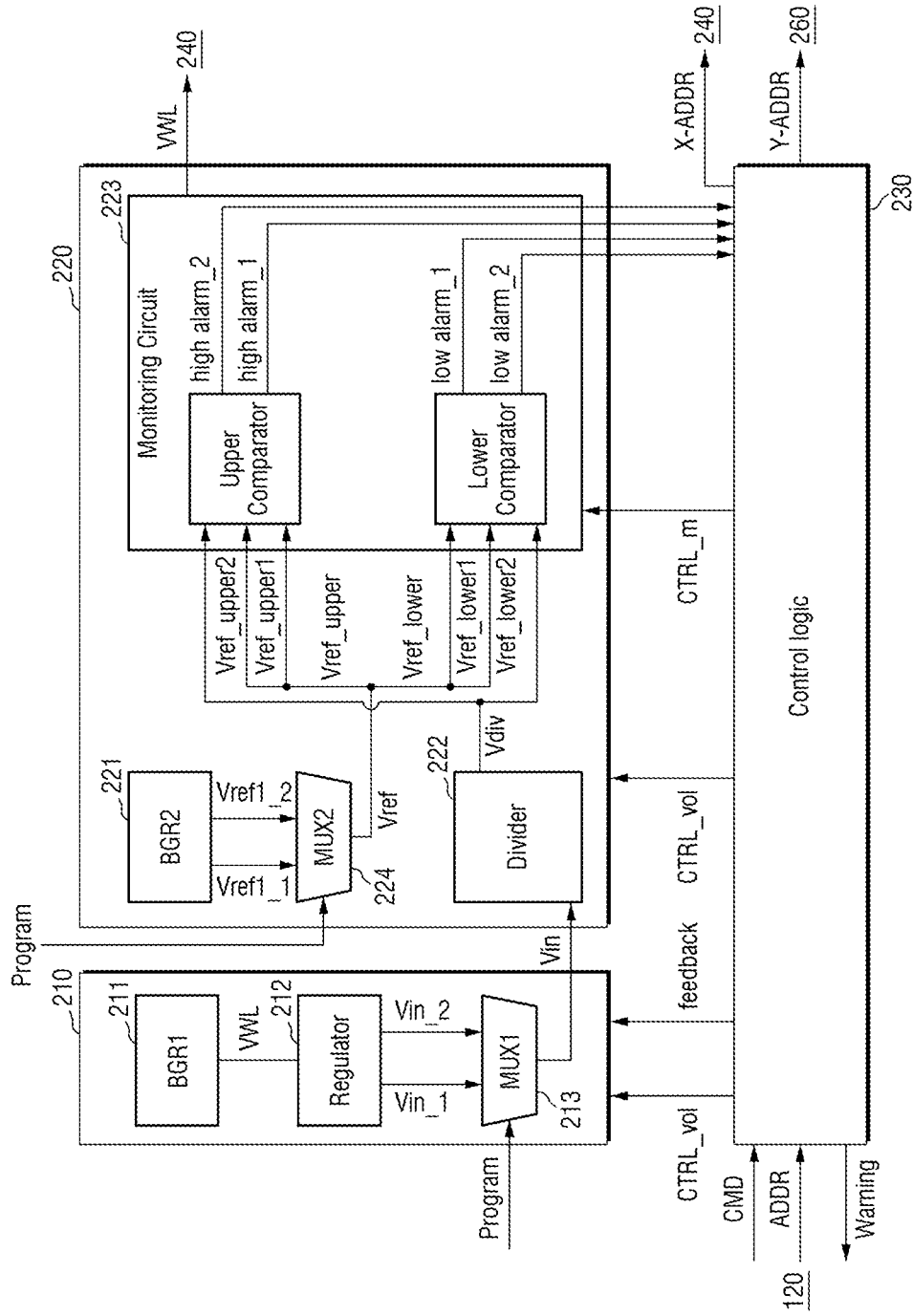
FIG. 18 is a block diagram illustrating an abnormal voltage monitoring device according to further still some further embodiments of the present disclosure.

FIG. 18 is a block diagram illustrating an abnormal voltage monitoring device according to further still some further embodiments of the present disclosure. The embodiments of FIG. 18 will be described based on differences with respect to FIG. 4.

Referring to FIG. 18, the voltage generator 210 may further include a first multiplexer 213 electrically connected to the regulator 212. The first multiplexer 213 may receive a program signal from an external device such as the control logic circuit 230, select any one of a first input voltage Vin_1 and a second input voltage Vin_2, which are received from the regulator 212, based on the program signal and output the selected one as the input voltage Vin.

The voltage monitor 220 may further include a second multiplexer 224 electrically connected to the second bandgap reference generation circuit 211. The second multiplexer 224 may receive the program signal from an external device such as the control logic circuit 230, select any one of a first reference voltage Vref_1 and a second reference voltage Vref_2, which are received from the second bandgap reference generation circuit 221, based on the program signal and output the selected one as the reference voltage Vref. The first and second reference voltages Vref_1 and Vref_2 may correspond to the first and second input voltages Vin_1 and Vin_2. Although FIG. 18 only shows the first and second input voltages Vin_1 and Vin_2 and the first and second reference voltages Vref_1 and Vref_2, the embodiments are not limited thereto. For example, the input voltage provided to the first multiplexer 213 may include the first input voltage, the second input voltage, ..., the nth input voltage, and the reference voltage provided to the second multiplexer 224 may include the first reference voltage, the second reference voltage, ..., the nth reference voltage.

When the word line voltage VWL includes two or more voltages, any one of the word line voltages may be selected and monitored, whereby the voltage to be monitored may selectively be determined. For example, when the abnormal voltage monitoring device monitors the voltages applied to the memory cell, the voltages applied to the memory cell may be various voltages such as a read voltage, a program voltage, an erase voltage, etc. in accordance with an operation command (read, program, erase, etc.). A voltage to be monitored may be selected from the plurality of voltages through the multiplexer in accordance with the operation command, whereby the plurality of voltages may efficiently be monitored.

Figure 19:
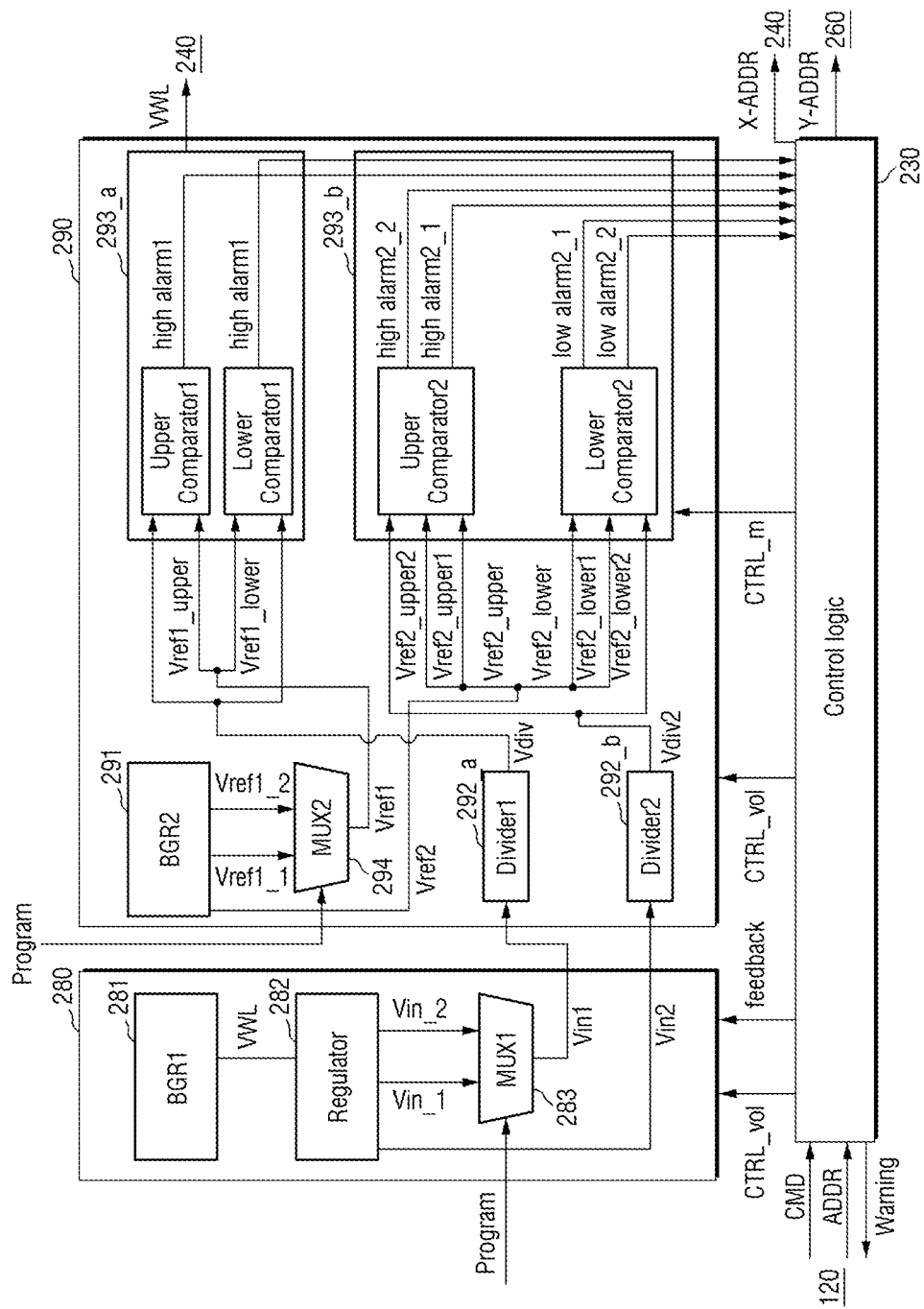
FIG. 19 is a block diagram illustrating an abnormal voltage monitoring device according to further still some further embodiments of the present disclosure.

FIG. 19 is a block diagram illustrating an abnormal voltage monitoring device according to further still some further embodiments of the present disclosure. The embodiments of FIG. 19 will be described based on differences with respect to FIGS. 4 and 18.

Referring to FIG. 19, a voltage generator 280 may include a first bandgap reference generation circuit 281, a regulator 282, and a first multiplexer 283. The regulator 282 may output input voltages Vin1_1 and Vin1_2, and an input voltage Vin2. A voltage monitor 290 may include a second bandgap reference generation circuit 291, a first voltage divider 292_a, a second voltage divider 292_b, a first monitoring circuit 293_a, a second monitoring circuit 293_b, and a second multiplexer 294. The second bandgap reference generation circuit 291 may generate reference voltages Vref1_1 and Vref1_2, and a reference voltage Vref2. The reference voltages Vref1_1 and Vref1_2 may be provided to the second multiplexer 294, and the reference voltage Vref2 may be provided to the first monitoring circuit 293_a and the second monitoring circuit 293_b. The reference voltage Vref2 may include an upper limit reference voltage Vref2_upper and a lower limit reference voltage Vref2_lower. The upper limit reference voltage Vref2_upper may include a first upper limit reference voltage Vref2_upper1 and a second upper limit reference voltage Vref2_upper2. The lower limit reference voltage Vref2_lower may include a first lower limit reference voltage Vref2_lower1 and a second lower limit reference voltage Vref2_lower2.

The structure of the first monitoring circuit 293_a may be similar to that of the monitoring circuit 223 of FIG. 5, and the structure of the second monitoring circuit 293_b may be similar to that of the monitoring circuit 223 of FIG. 13, Although FIG. 19 shows that the reference voltage Vref2 includes only the first upper limit reference voltage Vref2_upper1, the second upper limit reference voltage Vref2_upper2, the first lower limit reference voltage Vref2_lower1, and the second lower limit reference voltage Vref2_lower2, the embodiments are not limited thereto. For example, the upper limit reference voltage Vref2_upper may include a first upper limit reference voltage Vref2_upper1, a second upper limit reference voltage Vref2_upper2, ..., an nth upper limit reference voltage Vref2_uppern, and the lower limit reference voltage Vref2_lower may include a first lower limit reference voltage Vref2_lower1, a second lower limit reference voltage Vref2_lower2, ..., an nth lower limit reference voltage Vref2_lowern (n is a natural number of 2 or more).

When the several monitoring circuits are provided as above to respectively perform monitoring, a defective portion in the device may exactly be specified and then trimming may be performed for the voltage, whereby the probability of a defect on the operation may be lowered as compared with the case that one monitoring circuit is used to perform monitoring.

In concluding the detailed description, those skilled in the art will appreciate that many variations and modifications may be made to the embodiments without substantially departing from the principles of the present disclosure. Therefore, the disclosed embodiments of the disclosure are used in a generic and descriptive sense only and not for purposes of limitation.

What is claimed is:

1. An abnormal voltage monitoring device, comprising:
   a voltage divider configured to receive an input voltage to be applied to a memory cell, from a voltage generator comprising a first bandgap reference generation circuit, and configured to output a first distribution voltage based on the input voltage;
   a second bandgap reference generation circuit configured to output a reference voltage; and
   a monitoring circuit configured to receive the first distribution voltage from the voltage divider and the reference voltage from the second bandgap reference generation circuit, and configured to output an alarm signal responsive to comparing a voltage level of the first distribution voltage with that of the reference voltage,
   wherein the second bandgap reference generation circuit is configured to generate the reference voltage differently than the first bandgap reference generation circuit is configured to generate the input voltage, and
   wherein the first and second bandgap reference generation circuits respectively comprise different circuit structures such that the abnormal voltage monitoring device is configured to operate normally responsive to defective operation of one of the first and second bandgap reference generation circuits.

2. The abnormal voltage monitoring device of claim 1, wherein the first bandgap reference generation circuit comprises a first BJT and a second BJT, the second bandgap reference generation circuit comprises a third BJT and a fourth BJT, and a size ratio of the first BJT to the second BJT is different from that of the third BJT to the fourth BJT.

3. The abnormal voltage monitoring device of claim 2, wherein the first bandgap reference generation circuit is configured to generate the input voltage using an operational amplifier, and the second bandgap reference generation circuit is configured to generate the reference voltage without using the operational amplifier.

4. The abnormal voltage monitoring device of claim 3, wherein the second bandgap reference generation circuit is configured to generate the reference voltage using a current mirror.

5. The abnormal voltage monitoring device of claim 2, wherein the first bandgap reference generation circuit is configured to generate the input voltage using a current mirror, and the second bandgap reference generation circuit is configured to generate the reference voltage using an operational amplifier.

6. The abnormal voltage monitoring device of claim 2, wherein the size ratio of the first BJT to the second BJT is about 1:11, and the size ratio of the third BJT to the fourth BJT is about 1:8.

7. The abnormal voltage monitoring device of claim 1, wherein:
the input voltage comprises a write voltage to be applied to the memory cell to write data in the memory cell;
the reference voltage comprises a first upper limit reference voltage and a first lower limit reference voltage of the write voltage, the first lower limit reference voltage having a voltage level lower than that of the first upper limit reference voltage; and
the monitoring circuit is configured to output a first high alarm signal when a voltage level of the first distribution voltage is higher than that of the first upper limit reference voltage, and is configured to output a first low alarm signal when the voltage level of the first distribution voltage is lower than that of the first lower limit reference voltage.

8. The abnormal voltage monitoring device of claim 7, wherein:
the reference voltage further comprises a second upper limit reference voltage having a voltage level higher than that of the first upper limit reference voltage and a second lower limit reference voltage having a voltage level lower than that of the first lower limit reference voltage; and
the monitoring circuit is configured to output the first high alarm signal and a second high alarm signal different from the first high alarm signal when the voltage level of the first distribution voltage is higher than that of the second upper limit reference voltage, and is configured to output the first low alarm signal and a second low alarm signal different from the first low alarm signal when the voltage level of the first distribution voltage is lower than that of the second lower limit reference voltage.

9. The abnormal voltage monitoring device of claim 1, further comprising:
a first multiplexer and a second multiplexer, each of which is configured to receive a program signal from an external device, wherein the first multiplexer is electrically connected to the voltage generator and the voltage divider, and the second multiplexer is electrically connected to the second bandgap reference generation circuit and the monitoring circuit.

10. The abnormal voltage monitoring device of claim 1, further comprising:
a second voltage divider configured to receive the input voltage applied to the memory cell, from the voltage generator, and configured to output a second distribution voltage based on the input voltage; and
a second monitoring circuit configured to receive the second distribution voltage from the second voltage divider and the reference voltage from the second bandgap reference generation circuit, and configured to output an alarm signal by comparing a voltage level of the second distribution voltage with that of the reference voltage.

11. A storage device comprising:
a memory cell;
a voltage generator configured to generate an input voltage to be applied to the memory cell using a first bandgap reference generation circuit;
a control logic circuit configured to control operation of the voltage generator; and
a voltage monitor configured to monitor the input voltage based on a reference voltage,
wherein the voltage monitor comprises:
a second bandgap reference generation circuit that is configured to generate the reference voltage differently than the first bandgap reference generation circuit is configured to generate the input voltage;
a voltage divider configured to output a first distribution voltage based on the input voltage; and
a monitoring circuit configured to output an alarm signal responsive to comparing a voltage level of the reference voltage with that of the input voltage,
wherein the control logic circuit is configured to output a feedback signal to the voltage generator responsive to receiving the alarm signal,
wherein the first and second bandgap reference generation circuits respectively comprise different circuit structures such that the storage device is configured to operate normally responsive to defective operation of one of the first and second bandgap reference generation circuits.

12. The storage device of claim 11, wherein the first bandgap reference generation circuit is configured to generate the input voltage using an operational amplifier, and the second bandgap reference generation circuit is configured to generate the reference voltage without using the operational amplifier.

13. The storage device of claim 11, wherein:
the input voltage comprises a write voltage that is to be applied to the memory cell to write data in the memory cell;
the reference voltage comprises a first upper limit reference voltage and a first lower limit reference voltage of the write voltage, the first lower limit reference voltage having a voltage level lower than that of the first upper limit reference voltage; and
the monitoring circuit is configured to output a first high alarm signal when a voltage level of the first distribution voltage is higher than that of the first upper limit reference voltage, and is configured to output a first low alarm signal when the voltage level of the first distribution voltage is lower than that of the first lower limit reference voltage.

14. The storage device of claim 13, wherein:
the reference voltage comprises a second upper limit reference voltage having a voltage level higher than that of the first upper limit reference voltage and a second lower limit reference voltage having a voltage level lower than that of the first lower limit reference voltage; and the monitoring circuit is configured to output the first high alarm signal and a second high alarm signal different from the first high alarm signal when the voltage level of the first distribution voltage is higher than that of the second upper limit reference voltage, and is configured to output the first low alarm signal and a second low alarm signal different from the first low alarm signal when the voltage level of the first distribution voltage is lower than that of the second lower limit reference voltage.

15. The storage device of claim 13, wherein the feedback signal corresponds to the alarm signal.

16. The storage device of claim 15, wherein the voltage generator is configured to perform trimming of the input voltage to correspond to the feedback signal.

17. The storage device of claim 13, wherein the control logic circuit is configured to output a warning signal corresponding to the alarm signal to an external device.

18. A vehicle comprising:
a monitoring device configured to monitor driving data;
a storage device; and
an electronic control unit configured to perform a first write operation to write the driving data in the storage device,
wherein the storage device is configured to generate an input voltage using a first bandgap reference generation circuit, to generate a reference voltage using a second bandgap reference generation circuit, wherein the second bandgap reference generation circuit is configured to generate the reference voltage differently than the first bandgap reference generation circuit is configured to generate the input voltage, and to provide a warning signal to the electronic control unit responsive to comparing the input voltage with the reference voltage,
wherein the first and second bandgap reference generation circuits respectively comprise different circuit structures such that the storage device is configured to operate normally responsive to defective operation of one of the first and second bandgap reference generation circuits, and
wherein the electronic control unit is configured to receive the warning signal and to perform a second write operation to again write the driving data in the storage device.

19. The vehicle of claim 18, wherein the storage device comprises:
a voltage monitor;
a voltage generator configured to provide the input voltage to the voltage monitor; and
a control logic circuit, wherein the control logic circuit is configured to generate the warning signal when a voltage level of the input voltage is higher than that of an upper limit reference voltage or lower than that of a lower limit reference voltage, and is configured to output a feedback signal to the voltage generator to perform trimming of the input voltage based on the feedback signal.

20. The vehicle of claim 19, wherein the voltage monitor is configured to variably adjust the voltage levels of the upper limit reference voltage and the lower limit reference voltage.

* * * * *